(12) United States Patent
Chen et al.

(10) Patent No.: US 12,336,240 B2
(45) Date of Patent: Jun. 17, 2025

(54) TRANSISTOR INCLUDING DIELECTRIC BARRIER AND MANUFACTURING METHOD THEREOF

(71) Applicant: Taiwan Semiconductor Manufacturing Co., Ltd., Hsinchu (TW)

(72) Inventors: Shih-Cheng Chen, Hsinchu (TW); Zhi-Chang Lin, Hsinchu (TW); Jung-Hung Chang, Hsinchu (TW); Chien Ning Yao, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 573 days.

(21) Appl. No.: 17/566,560

(22) Filed: Dec. 30, 2021

(65) Prior Publication Data
US 2022/0344465 A1    Oct. 27, 2022

Related U.S. Application Data

(60) Provisional application No. 63/179,020, filed on Apr. 23, 2021.

(51) Int. Cl.
| H10D 62/10 | (2025.01) |
| H10D 30/01 | (2025.01) |
| H10D 30/67 | (2025.01) |
| H10D 84/01 | (2025.01) |
| H10D 84/03 | (2025.01) |
| H10D 84/83 | (2025.01) |

(52) U.S. Cl.
CPC ......... *H10D 62/121* (2025.01); *H10D 30/031* (2025.01); *H10D 30/6713* (2025.01); *H10D 30/6735* (2025.01); *H10D 30/6757* (2025.01); *H10D 84/0128* (2025.01); *H10D 84/013* (2025.01); *H10D 84/038* (2025.01); *H10D 84/834* (2025.01)

(58) Field of Classification Search
CPC .......... H01L 29/0673; H01L 29/42392; H01L 29/66787; H01L 29/78696
See application file for complete search history.

(56) References Cited

U.S. PATENT DOCUMENTS

| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |

(Continued)

*Primary Examiner* — Evren Seven
*Assistant Examiner* — Cole Leon Lindsey
(74) *Attorney, Agent, or Firm* — Seed IP Law Group

(57) ABSTRACT

An integrated circuit includes a first nanostructure transistor and a second nanostructure transistor on a substrate. The source/drain regions of the first nanostructure are electrically isolated from the semiconductor substrate by dielectric barriers. The source/drain regions of the second nanostructure transistor in direct contact with the semiconductor substrate.

20 Claims, 24 Drawing Sheets

(56) References Cited

U.S. PATENT DOCUMENTS

| | | |
|---|---|---|
| 9,881,993 B2 | 1/2018 | Ching et al. |
| 2018/0301564 A1* | 10/2018 | Kwon .................. H10D 64/251 |
| 2020/0266271 A1* | 8/2020 | Lin ...................... H10D 64/017 |
| 2022/0310602 A1* | 9/2022 | Greene ................ H10D 62/115 |

* cited by examiner

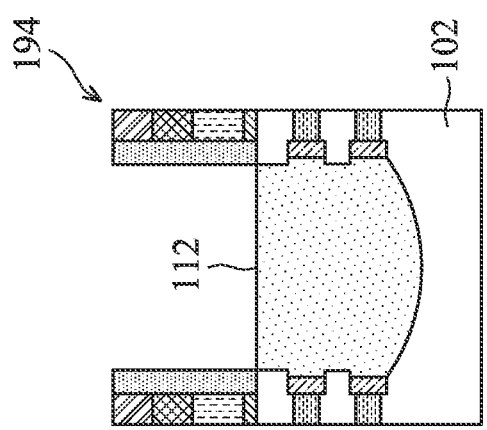
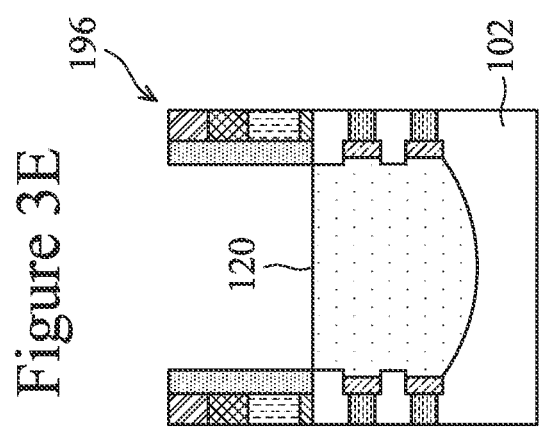
Figure 3A    Figure 3B
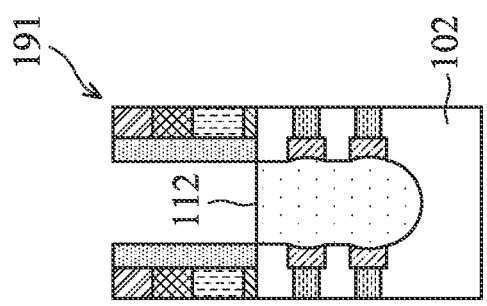
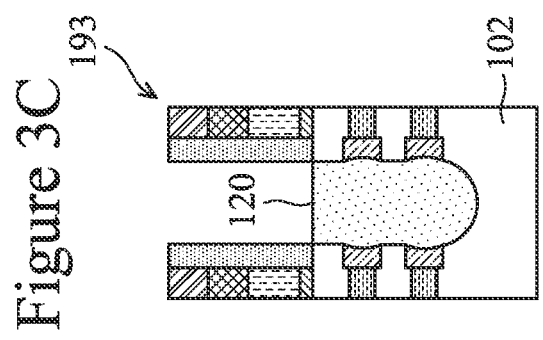
Figure 3C    Figure 3D
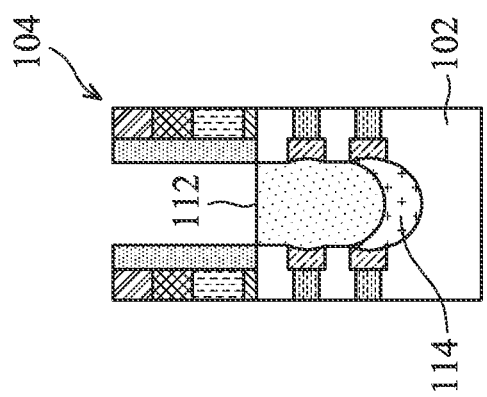
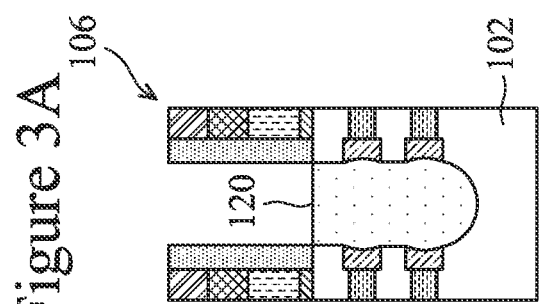
Figure 3E    Figure 3F
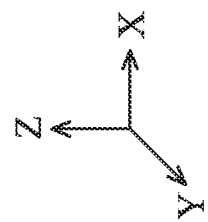

500

```
┌─────────────────────────────────────┐
│ FORM, OVER A SEMICONDUCTOR SUBSTRATE,│
│ A FIRST FIN INCLUDING A PLURALITY    │
│ OF SEMICONDUCTOR NANOSTRUCTURES      │──502
│ COLLECTIVELY CORRESPONDING TO A      │
│ FIRST CHANNEL REGION OF A FIRST GATE │
│ ALL AROUND TRANSISTOR                │
└─────────────────────────────────────┘
                  ↓
┌─────────────────────────────────────┐
│ FORM, OVER THE SEMICONDUCTOR         │
│ SUBSTRATE, A SECOND FIN SEPARATED FROM│
│ THE FIRST FIN BY A FIRST TRENCH AND  │
│ INCLUDING A PLURALITY OF SECOND      │──504
│ SEMICONDUCTOR NANOSTRUCTURES         │
│ COLLECTIVELY CORRESPONDING TO A      │
│ SECOND CHANNEL REGION OF A SECOND    │
│ GATE ALL AROUND TRANSISTOR           │
└─────────────────────────────────────┘
                  ↓
┌─────────────────────────────────────┐
│ DEPOSIT A DIELECTRIC MATERIAL IN     │
│ RECESSES BETWEEN THE PLURALITY OF    │
│ FIRST SEMICONDUCTOR NANOSTRUCTURES,  │──506
│ BETWEEN THE PLURALITY OF SECOND      │
│ SEMICONDUCTOR NANOSTRUCTURES, AND    │
│ ON A BOTTOM OF THE FIRST TRENCH      │
└─────────────────────────────────────┘
                  ↓
┌─────────────────────────────────────┐
│ EPITAXIALLY GROW A COMMON            │
│ SOURCE/DRAIN REGION OF THE FIRST AND │
│ SECOND GATE ALL AROUND TRANSISTORS   │──508
│ ON THE DIELECTRIC MATERIAL AND IN    │
│ CONTACT WITH THE FIRST AND SECOND    │
│ SEMICONDUCTOR NANOSTRUCTURES         │
└─────────────────────────────────────┘
```

Figure 5

TRANSISTOR INCLUDING DIELECTRIC BARRIER AND MANUFACTURING METHOD THEREOF

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are cross-sectional views of various transistors of an integrated circuit, in accordance with some embodiments.

FIG. 5 is a flow diagram of a process for forming an integrated circuit, in accordance with some embodiments.

DETAILED DESCRIPTION

Figure 1:
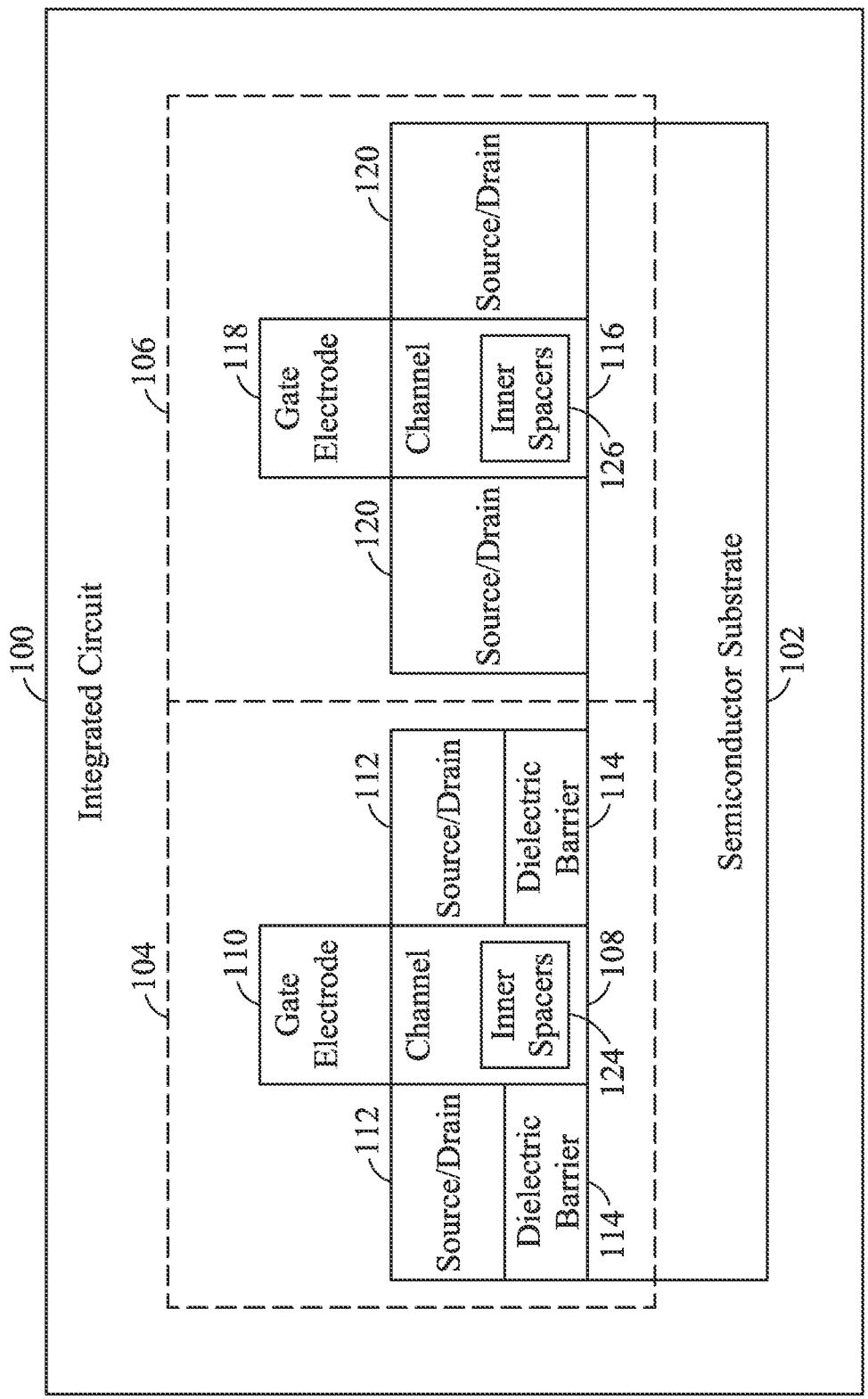
FIG. 1 is a block diagram of an integrated circuit 100, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions above the semiconductor substrate and in contact with the nanostructures. Embodiments of the present disclosure reduce leakage currents from the source/drain regions by forming a dielectric barrier between a bottom of the source/drain regions and the semiconductor substrate. The dielectric barriers help to prevent the flow of leakage currents from the source/drain regions to the semiconductor substrate because it can minimize the undesired current flow caused by a parasitic transistor. This can greatly improve the overall functionality of the integrated circuit by substantially eliminating a major source of power consumption. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

FIG. 1 is a block diagram of an integrated circuit 100, in accordance with some embodiments. The integrated circuit 100 includes a semiconductor substrate 102. The integrated circuit also includes a first transistor 104 and a second transistor 106 above the semiconductor substrate 102. As set forth in more detail below, the integrated circuit 100 selectively utilizes dielectric regions to improve the performance of the first transistor 104 without harming the performance of the second transistor 106.

The first transistor 104 includes a channel region 108, a gate electrode 110, and source/drain regions 112. The first transistor 104 can be operated by applying a voltage to the gate electrode 110. This can prevent or enable current to flow between the source/drain regions 112 through the channel region 108.

The first transistor 104 also includes dielectric barriers 114 below the source/drain regions 112. In particular, a respective dielectric barrier 114 is positioned between the semiconductor substrate 102 and each of the source/drain regions 112. The dielectric barriers 114 may be positioned in contact with a top surface of the semiconductor substrate 112 and the bottom surfaces of the source/drain regions 112.

The presence of the dielectric barriers 114 ensures that leakage currents will not flow from the source/drain regions 112 into the semiconductor substrate 102. This can greatly enhance the efficiency of the first transistor 104 by substantially eliminating leakage currents. This reduces power consumption and heat generation.

In practice, the integrated circuit 100 may have a very large number of transistors of the same type as the first transistor 104. Each of these transistors may have the dielectric barrier 114 to help prevent leakage currents. Accordingly, the dielectric barrier 114 can be utilized to substantially eliminate leakage current from thousands or millions of transistors of a same type as the first transistor 104 in the integrated circuit 100. This results in a very large reduction in power consumption and heat generation for the integrated circuit 100.

The second transistor 106 includes a channel region 116, a gate electrode 118, and source/drain regions 120. The second transistor 106 can be operated by applying a voltage to the gate electrode 118. This can prevent or enable current to flow between the source/drain regions 120 through the channel region 116.

The second transistor 106 differs from the first transistor 104 in that the dielectric barriers 114 are not present in the second transistor 106. Accordingly, the source/drain regions 120 may be positioned directly on the semiconductor substrate 102. In some embodiments, the second transistor 106 is of a different type than the first transistor 104. There may be benefits to the second transistor 106 in maintaining direct contact between the source/drain regions 120 and the semiconductor substrate 102. Accordingly, the second transistor 106 is formed without the dielectric barriers 114. The integrated circuit 100 may include a large number of transistors of the same type as the second transistor 106.

In some embodiments, the first transistor 104 is an N-type transistor and the second transistor 106 is a P-type transistor. In this case, the source and drain regions 112 of the first transistor 104 may be doped with N-type dopants species. The source/drain regions 120 of the second transistor 106 may be doped with P-type dopant species. In some cases, N-type transistors may be more susceptible to leakage currents from source/drain regions 112 into the semiconductor substrate. Accordingly, utilizing dielectric barriers 114 in N-type transistors of the integrated circuit 100 may result in a large reduction in leakage currents and corresponding overall power dissipation in heat generation.

P-type transistors may be less susceptible to leakage currents from source/drain regions into a semiconductor substrate. Accordingly, there may be less benefit in utilizing dielectric barriers for the transistor 106. Furthermore, the P-type second transistor 106 may benefit from strain imparted on the source/drain regions 120 by the semiconductor substrate 102. The strain can be introduced by a mismatch in crystal lattices between the semiconductor substrate 102 and the source/drain regions 120. In particular, if the semiconductor substrate 102 has a larger crystal lattice structure then the source/drain regions 120, then the semiconductor substrate 102 may impart a tensile strain onto the source/drain regions 120, thereby improving conductivity of the source/drain regions 120. In other examples, the mismatch between crystal glasses of the semiconductor substrate 102 and the source/drain regions 120 may introduce compressive strain onto the source/drain regions 120. In any case, the presence of a dielectric barrier between the source/drain regions 120 and the semiconductor substrate 102 would result in no tensile or compressive strain being imparted to the source/drain regions 120. Therefore, in some embodiments, it is beneficial to have no dielectric barrier separating the source/drain regions 120 from the semiconductor substrate 102.

In some embodiments, the first and second transistors 104 and 106 are nanostructure transistors. In this case, the channel regions 108 and 116 are each made of a plurality of semiconductor nanostructures extending between the source/drain regions 112 in the case of the first transistor 104, and between the source/drain regions 120 in the case of the second transistor 106. The semiconductor nanostructures may include nanosheets, nanowires, or other types of nanostructures. The channel regions 108 and 116 may be part of respective fin structures extending above the semiconductor substrate 102. Other types of transistors may be utilized without departing from the scope of the present disclosure.

In some embodiments, the first transistor 104 includes inner spacers 124. In this case, the channel region 108 includes a plurality of semiconductor nanostructures separated from each other vertically. Each semiconductor Nanostructure extends between the source/drain regions 112. The gate electrode 110 wraps around each of the semiconductor nanostructures. The inner spacers 124 are dielectric regions that isolate the gate electrode 110 from the source/drain regions 112. The inner spacers 124 are positioned between the semiconductor nanostructures near the ends of the semiconductor nanostructures. Though not apparent in the block diagram of FIG. 1, each inner spacer 124 may abut the gate electrode 110 and the source/drain region 112. The second transistor 106 may also include inner spacers 126. The inner spacers 126 may be substantially similar to the inner spacers 124 except that the inner spacers 126 electrically isolate the gate electrode 118 of the transistor 106 from the source/drain regions 120 of the transistor 106.

In some embodiments, the dielectric barriers 114 are made of a same dielectric material as the inner spacers 124. Furthermore, the dielectric barrier 114 and the inner spacers 124 may be formed in a same deposition process. After the dielectric material is deposited in the deposition process, portions of the dielectric material may be removed, thereby forming the individual dielectric barriers 114 and inner spacers 124. Other materials and processes can be utilized for the dielectric barriers 114 without departing from the scope of the present disclosure.

Figure 2A:
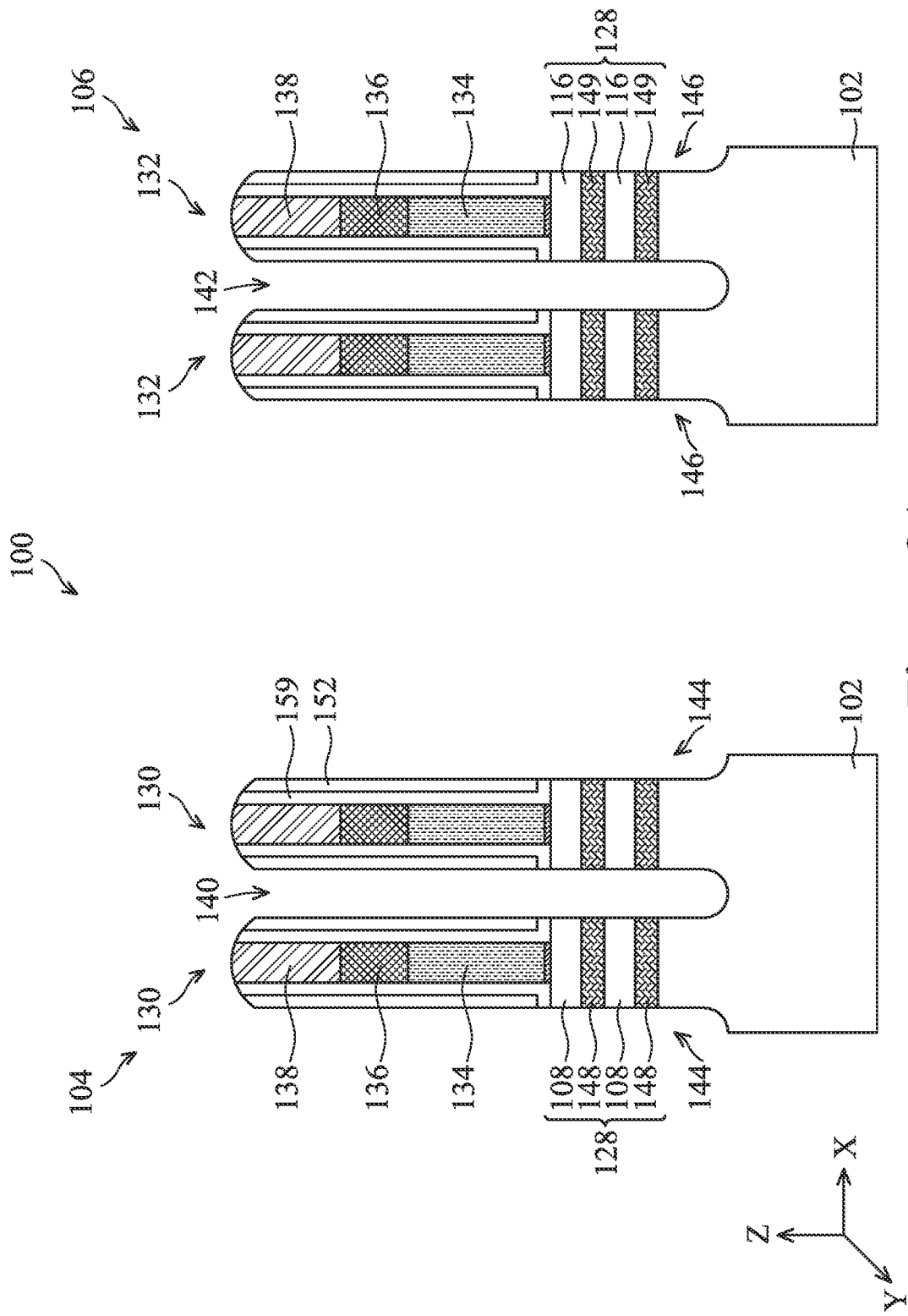
FIGS. 2A-2T are cross-sectional views of an integrated circuit, at various stages of processing, in accordance with some embodiments.
Figure 2B:
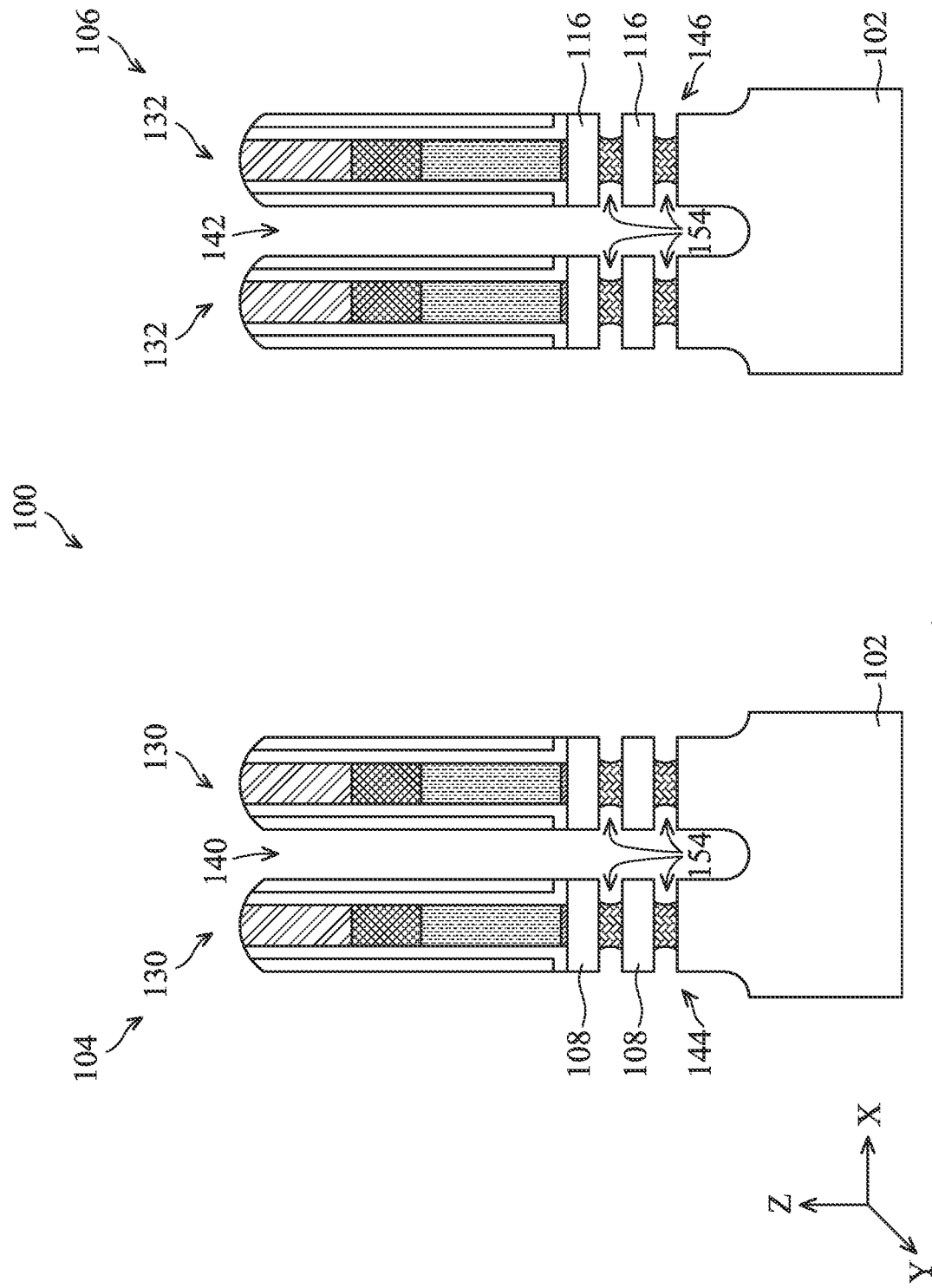
Figure 2C:
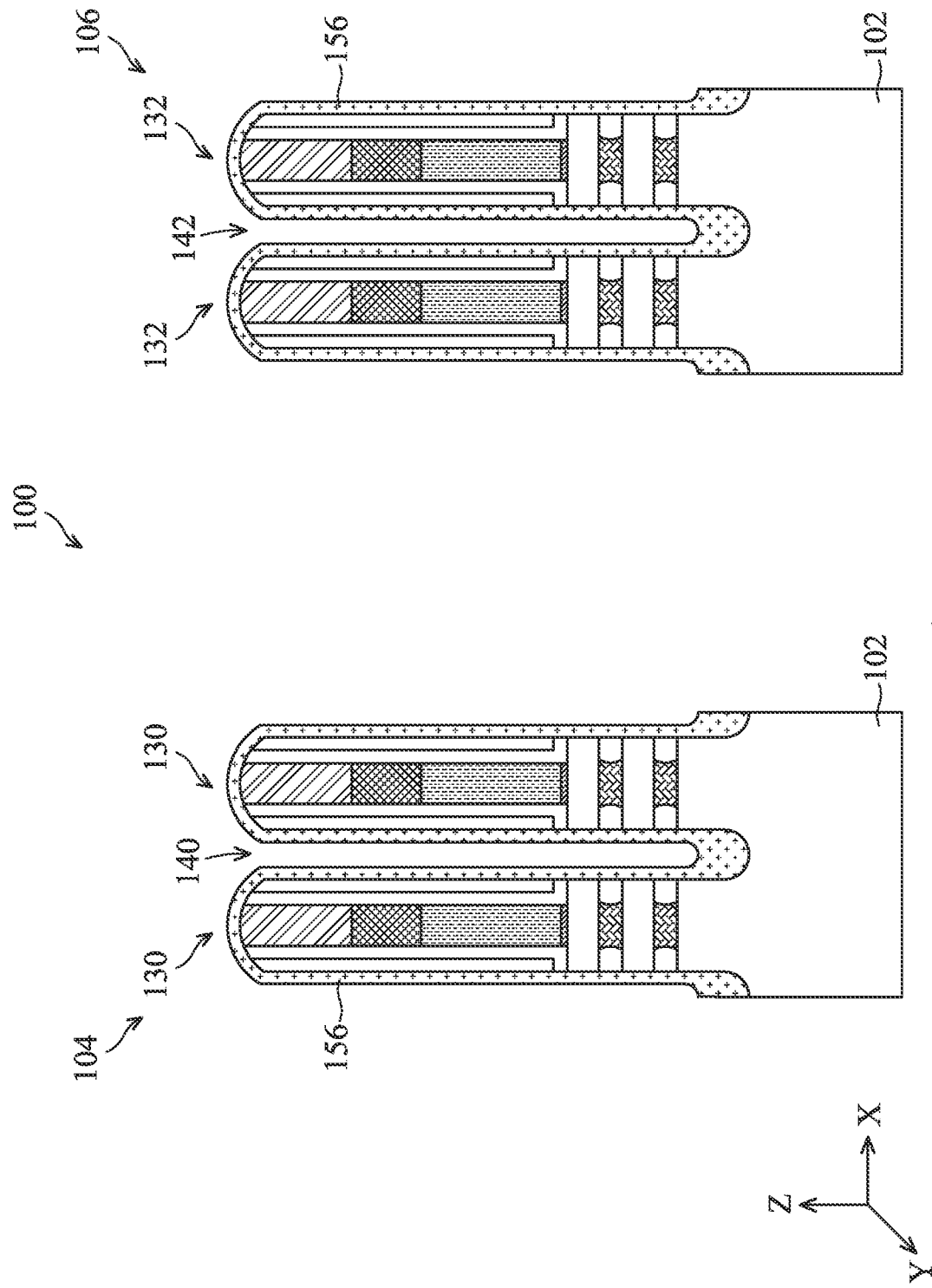
Figure 2D:
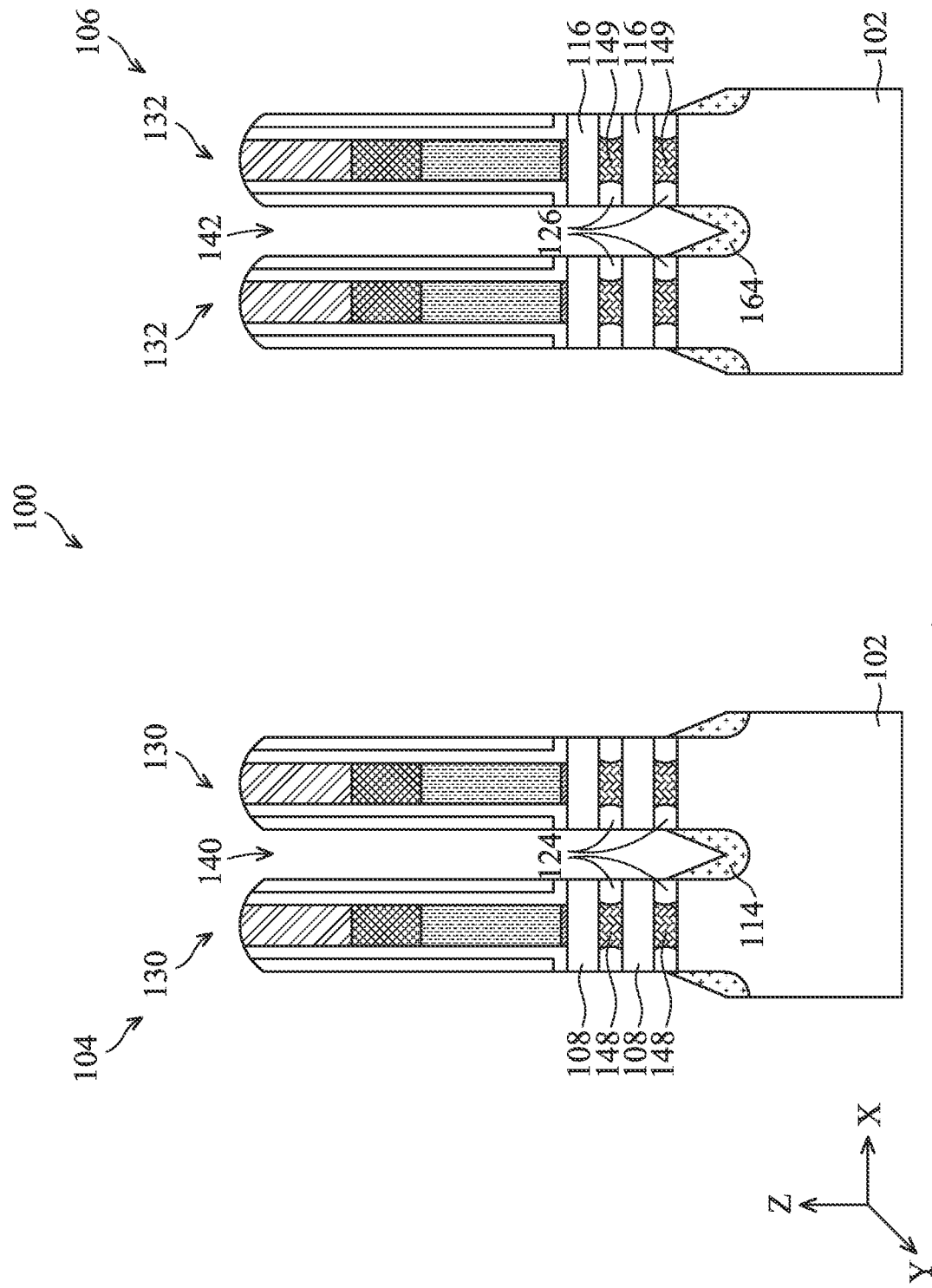
Figure 2E:
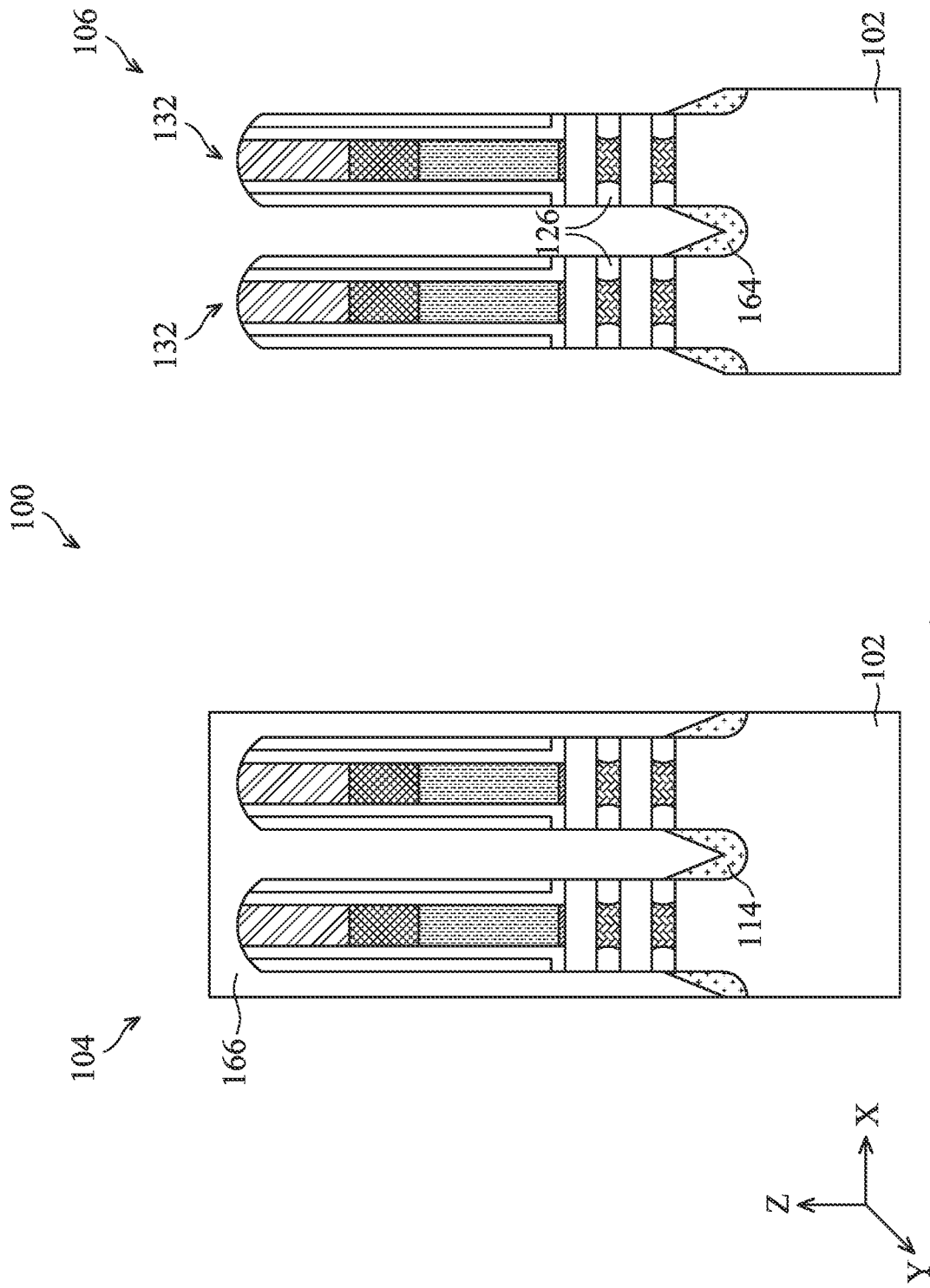
Figure 2F:
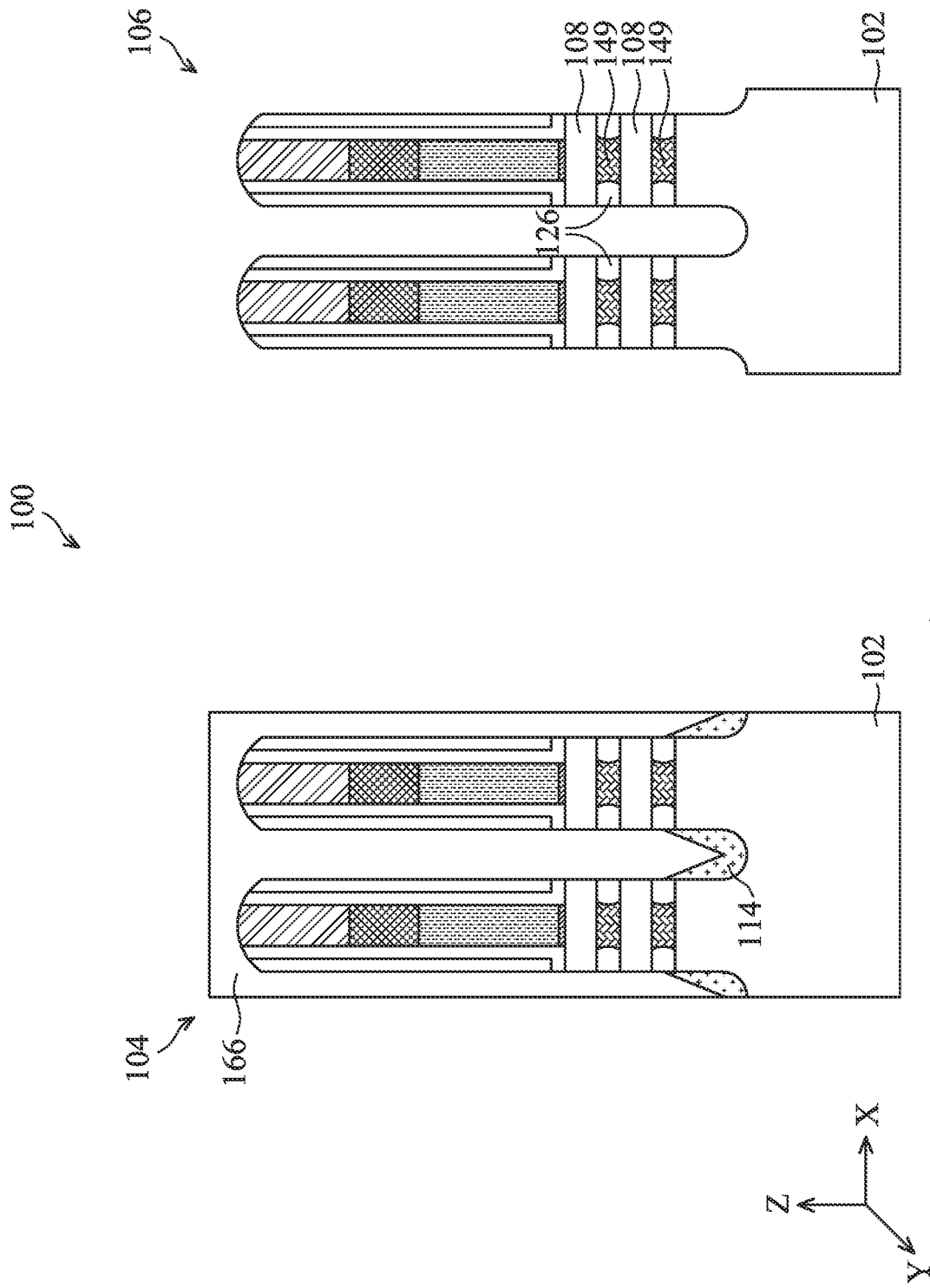
Figure 2G:
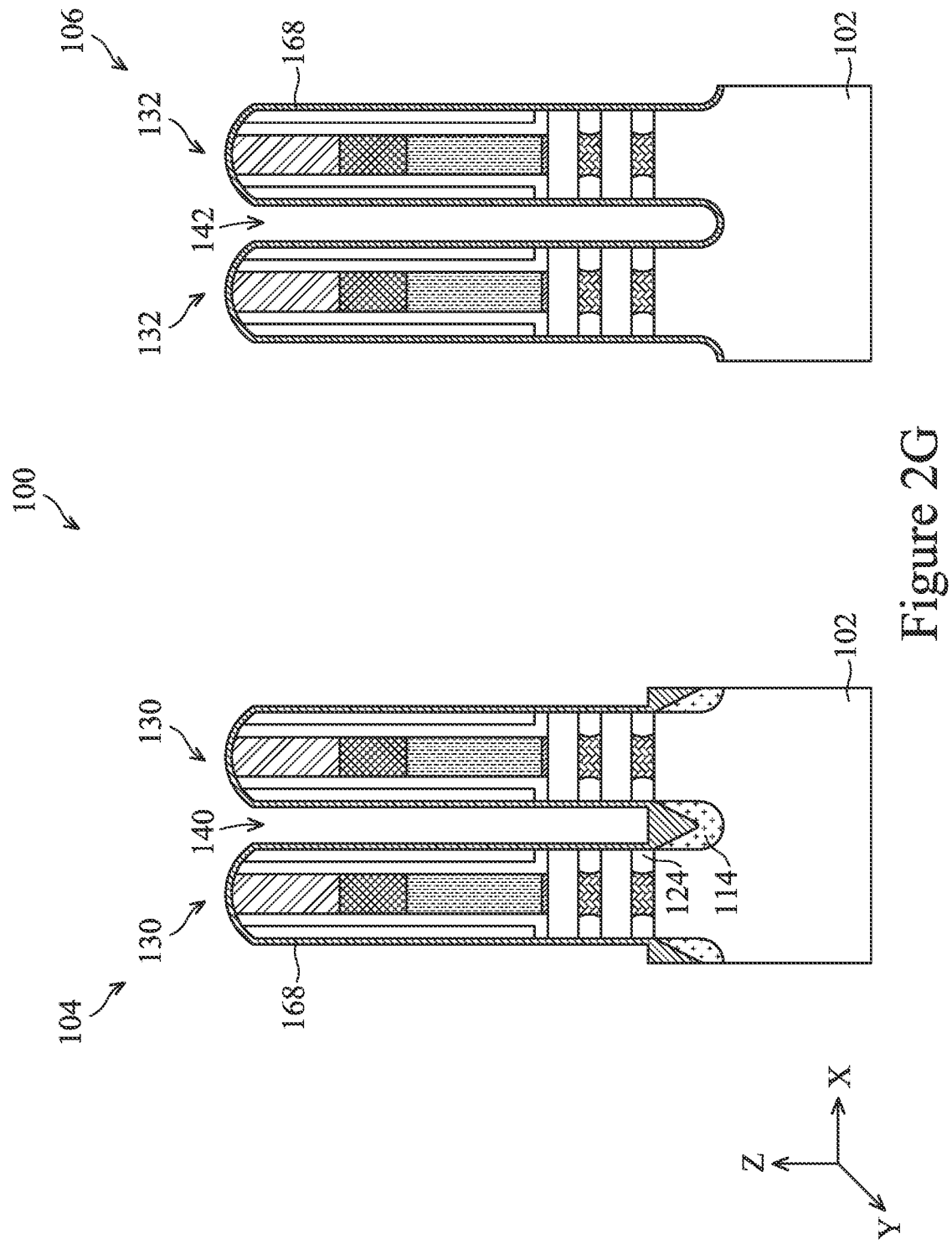
Figure 2H:
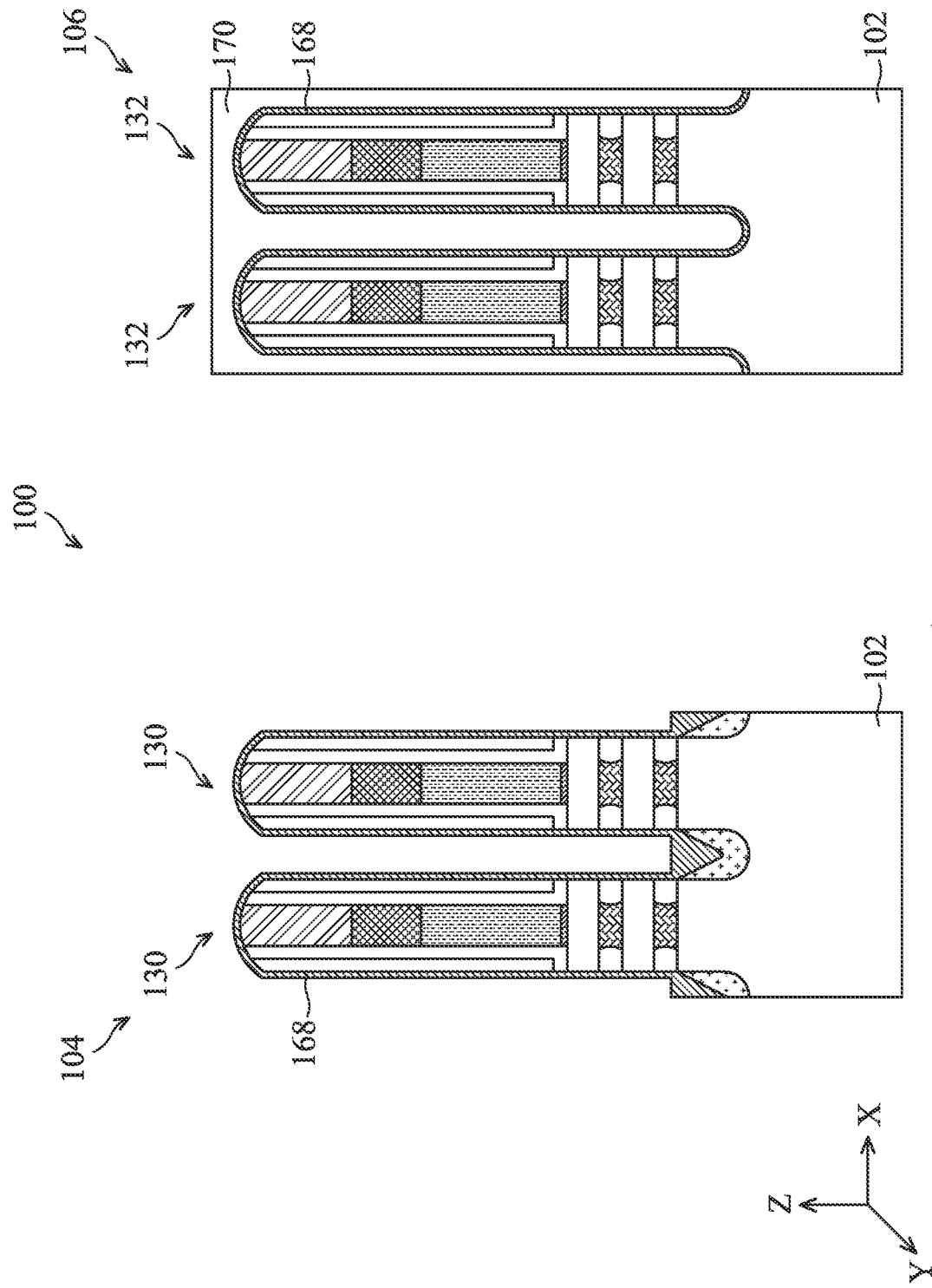
Figure 2I:
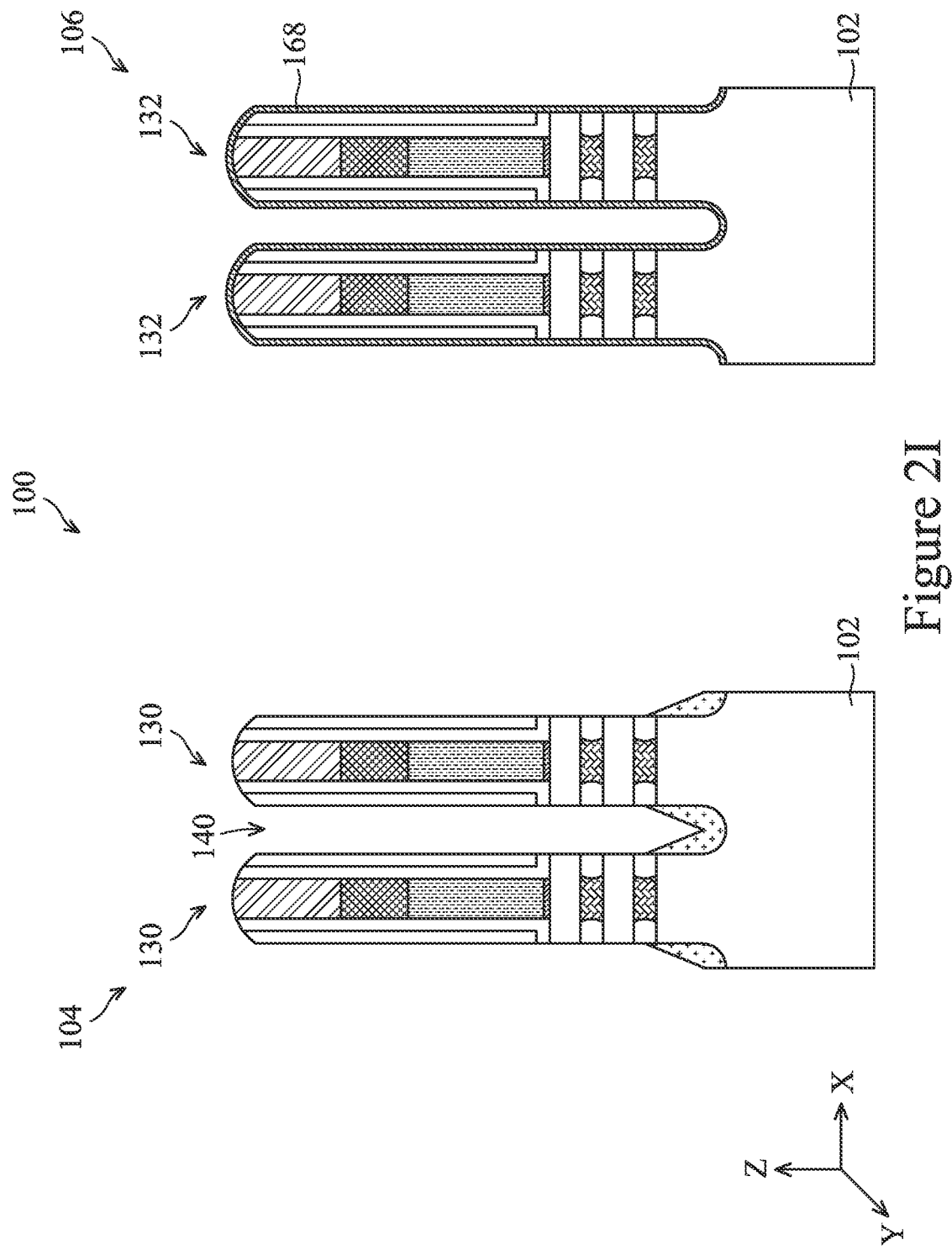
Figure 2J:
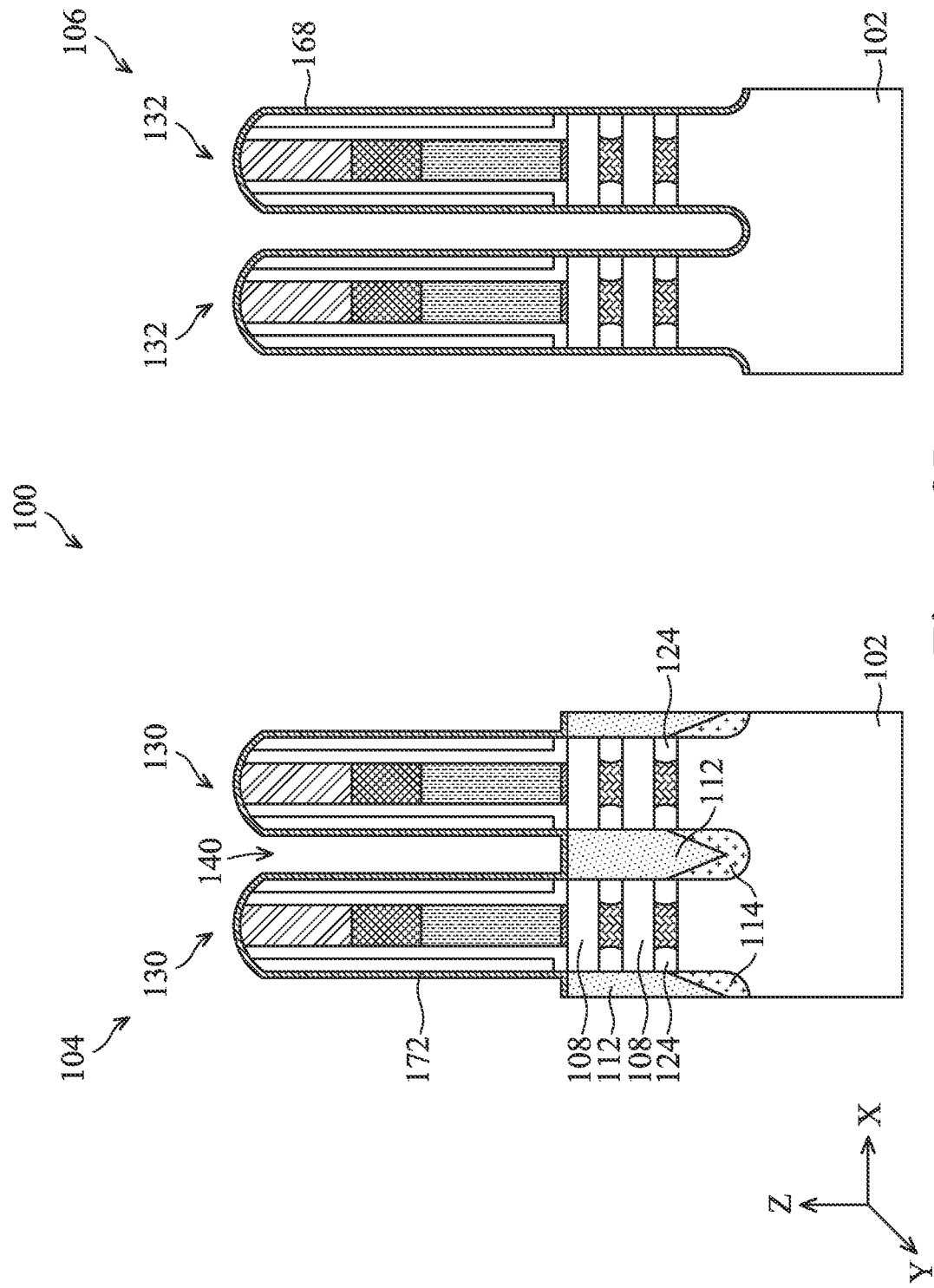
Figure 2K:
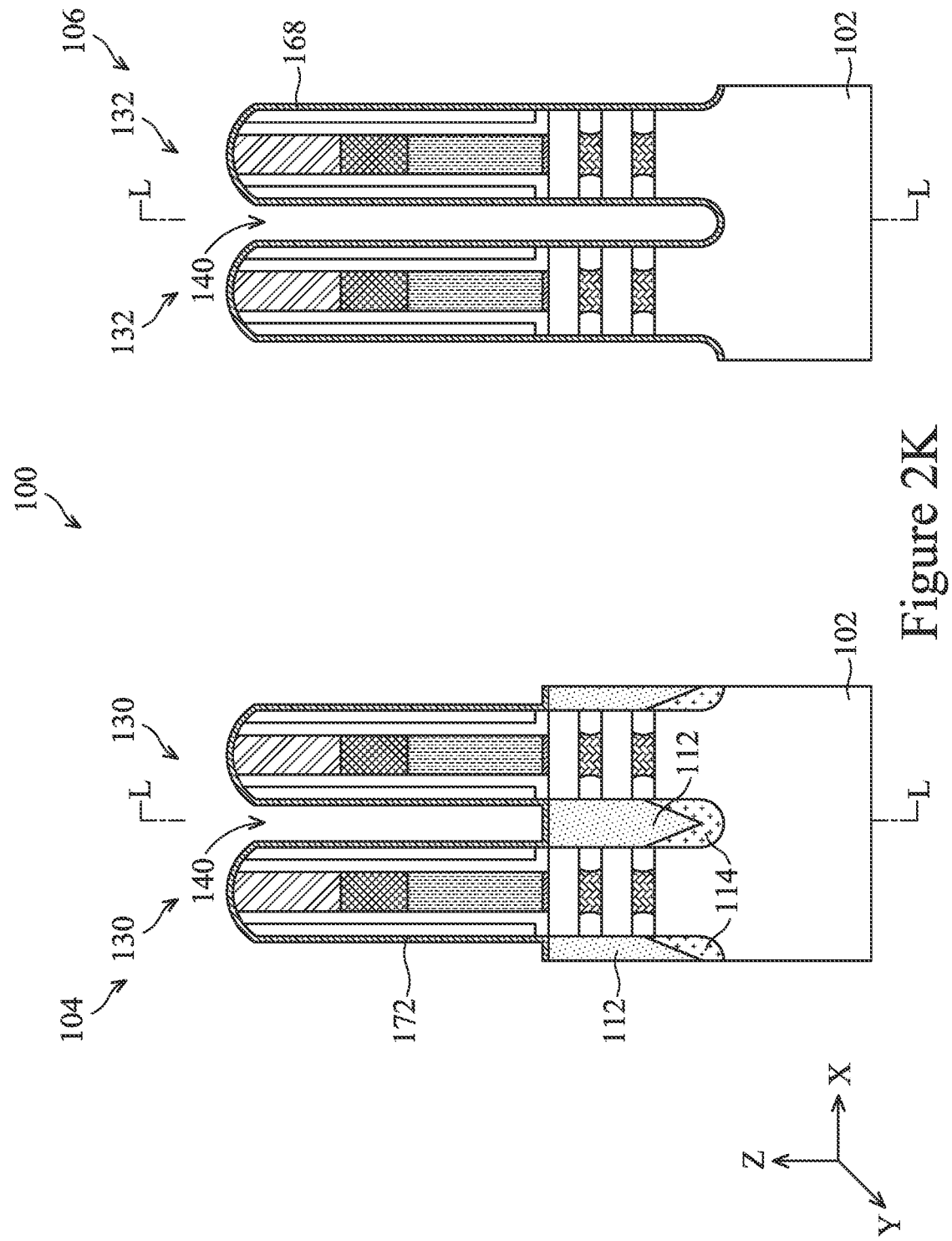
Figure 2L:
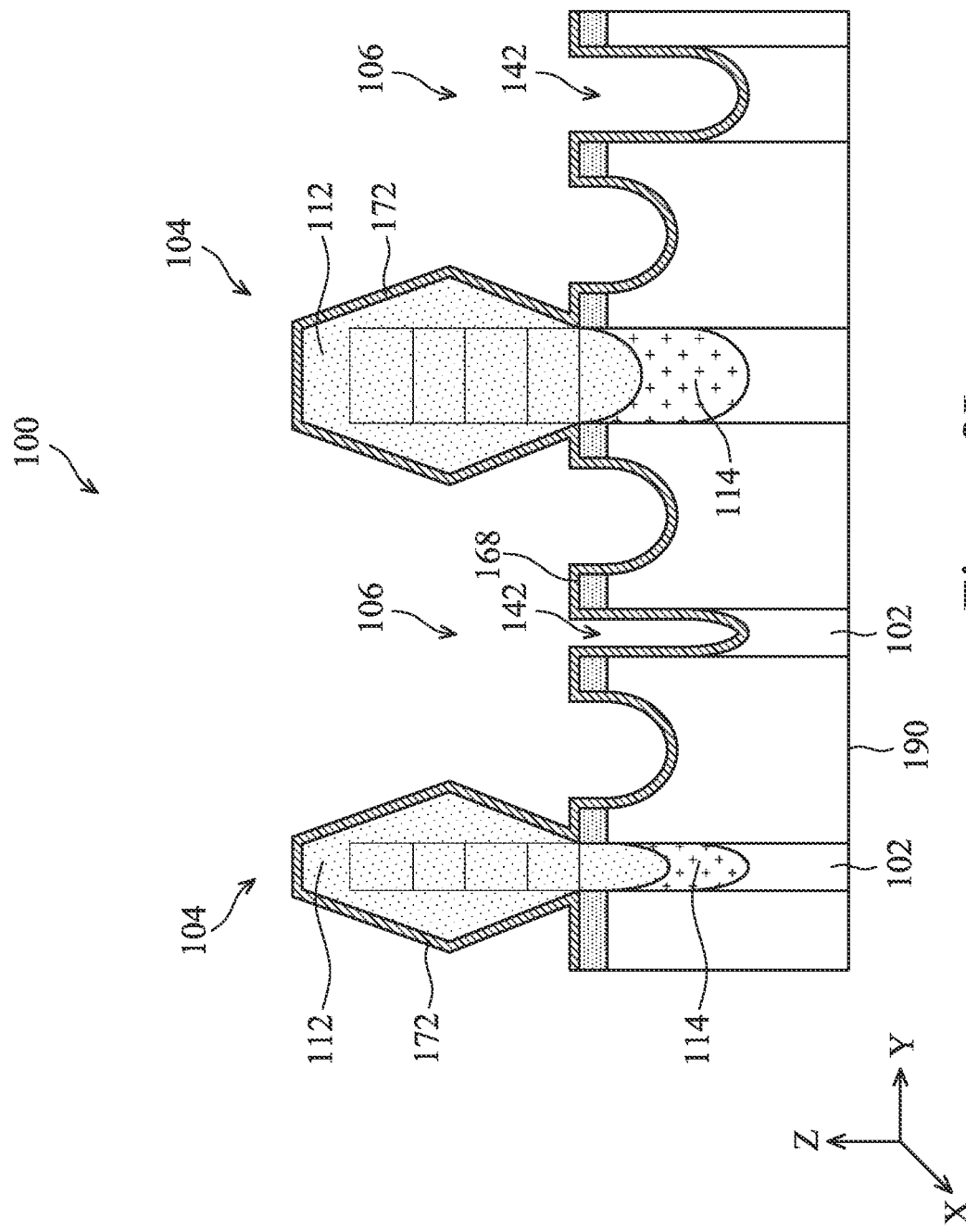
Figure 2M:
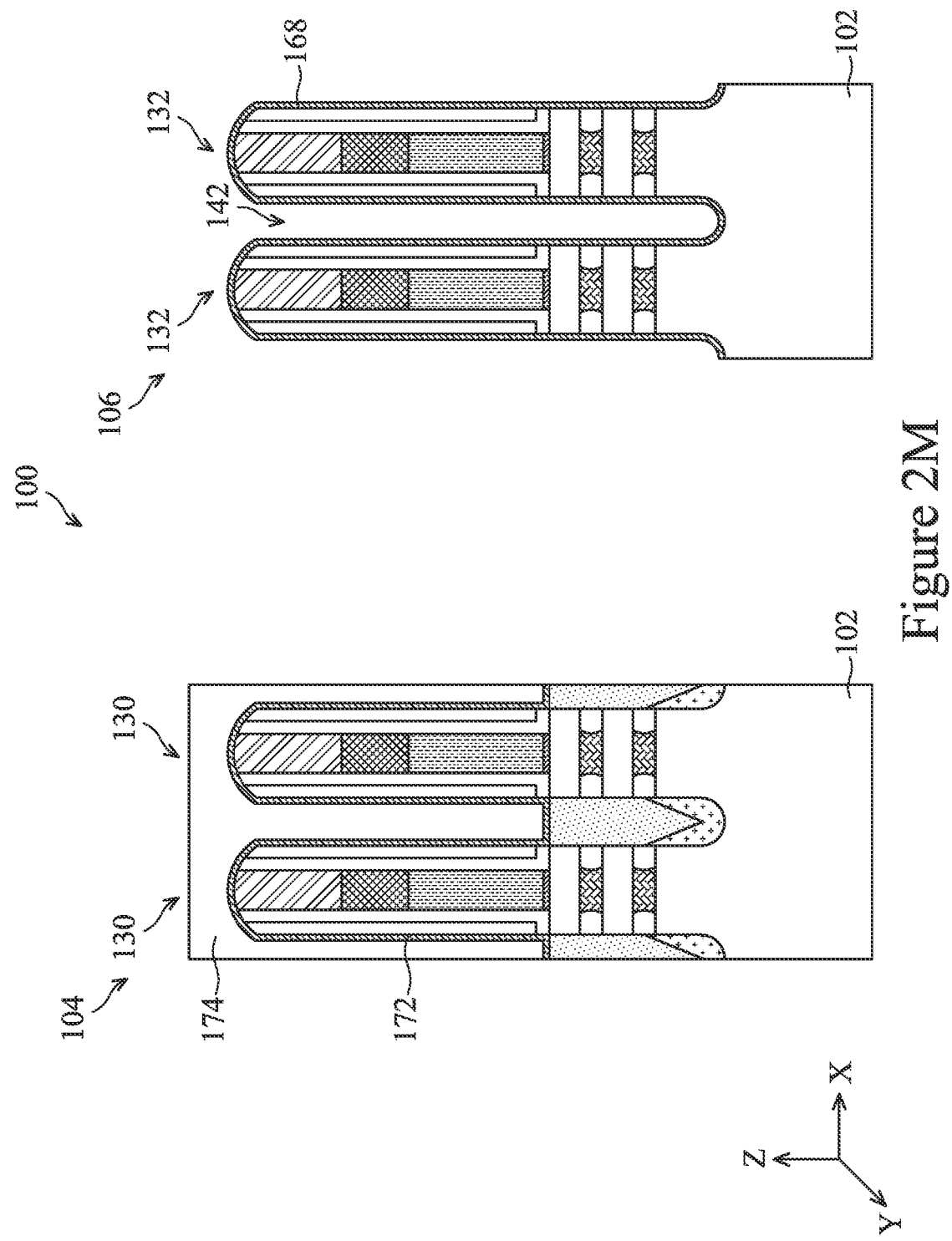
Figure 2N:
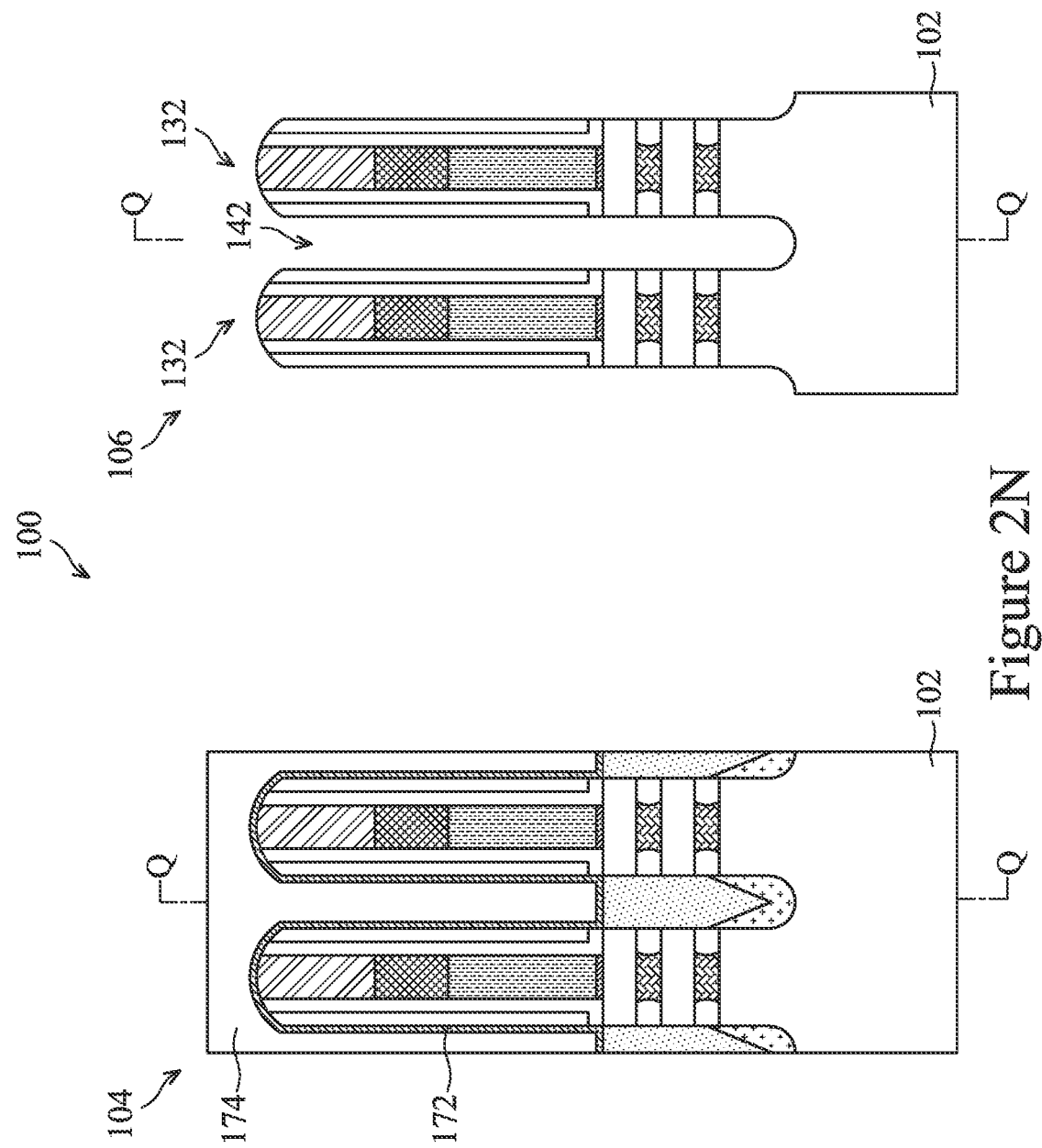
Figure 20:
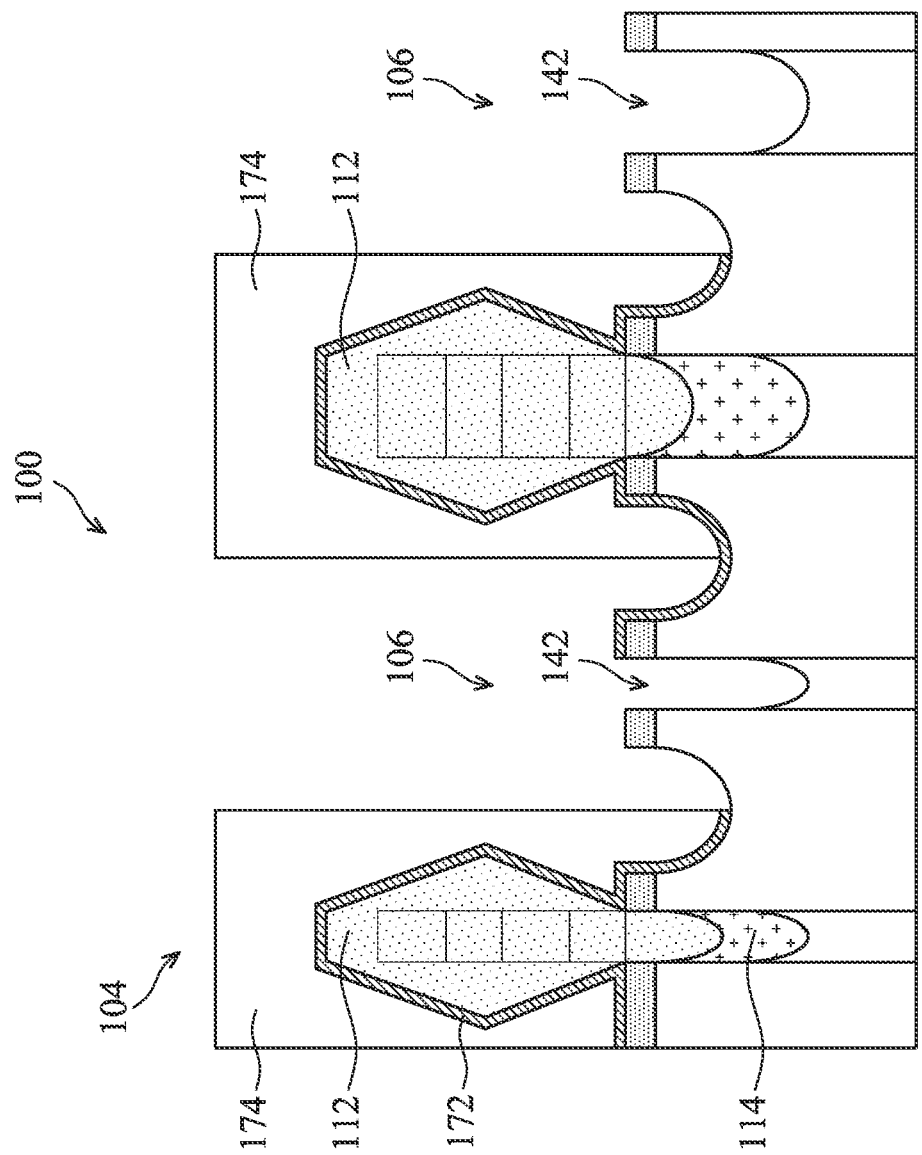
Figure 2P:
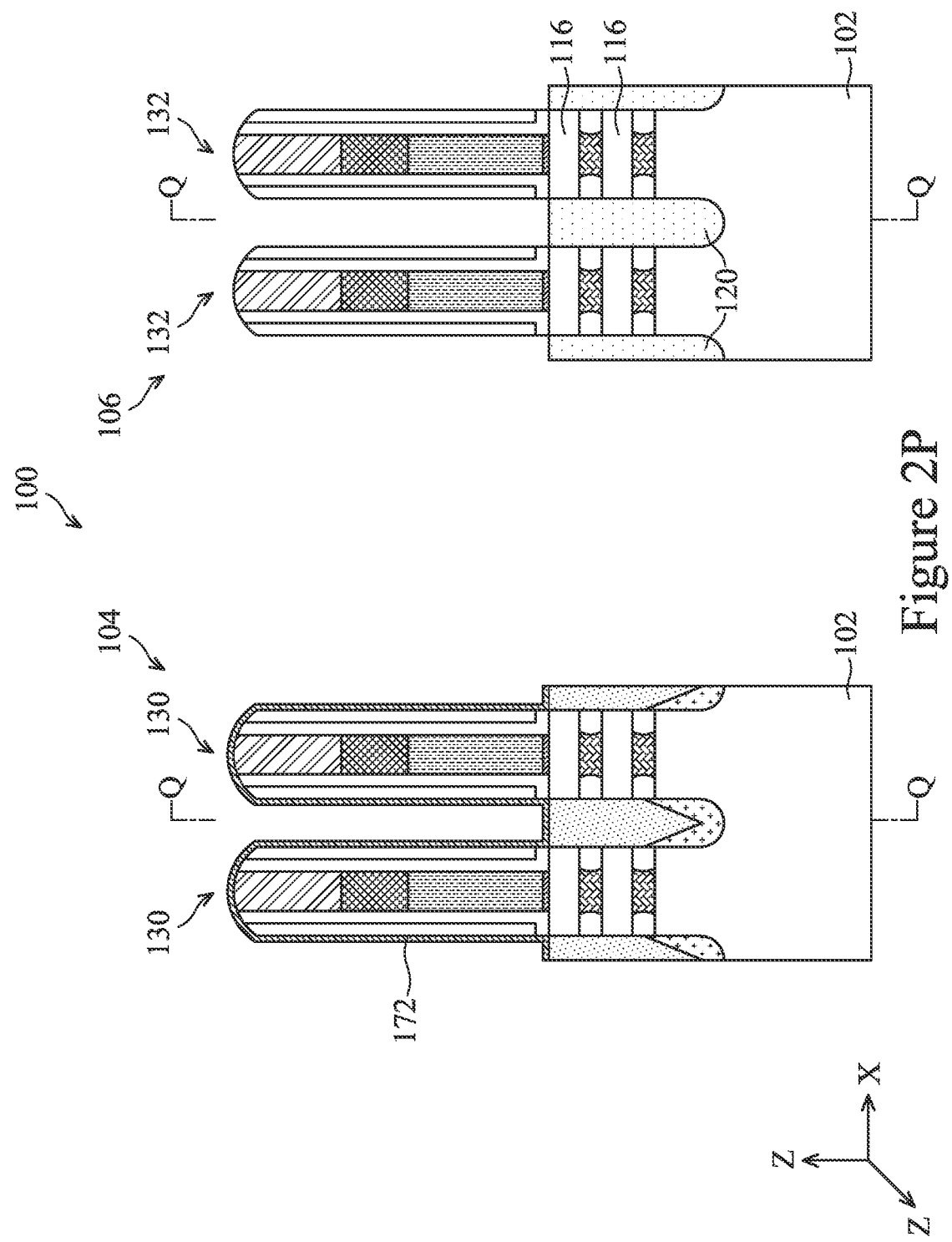
Figure 2Q:
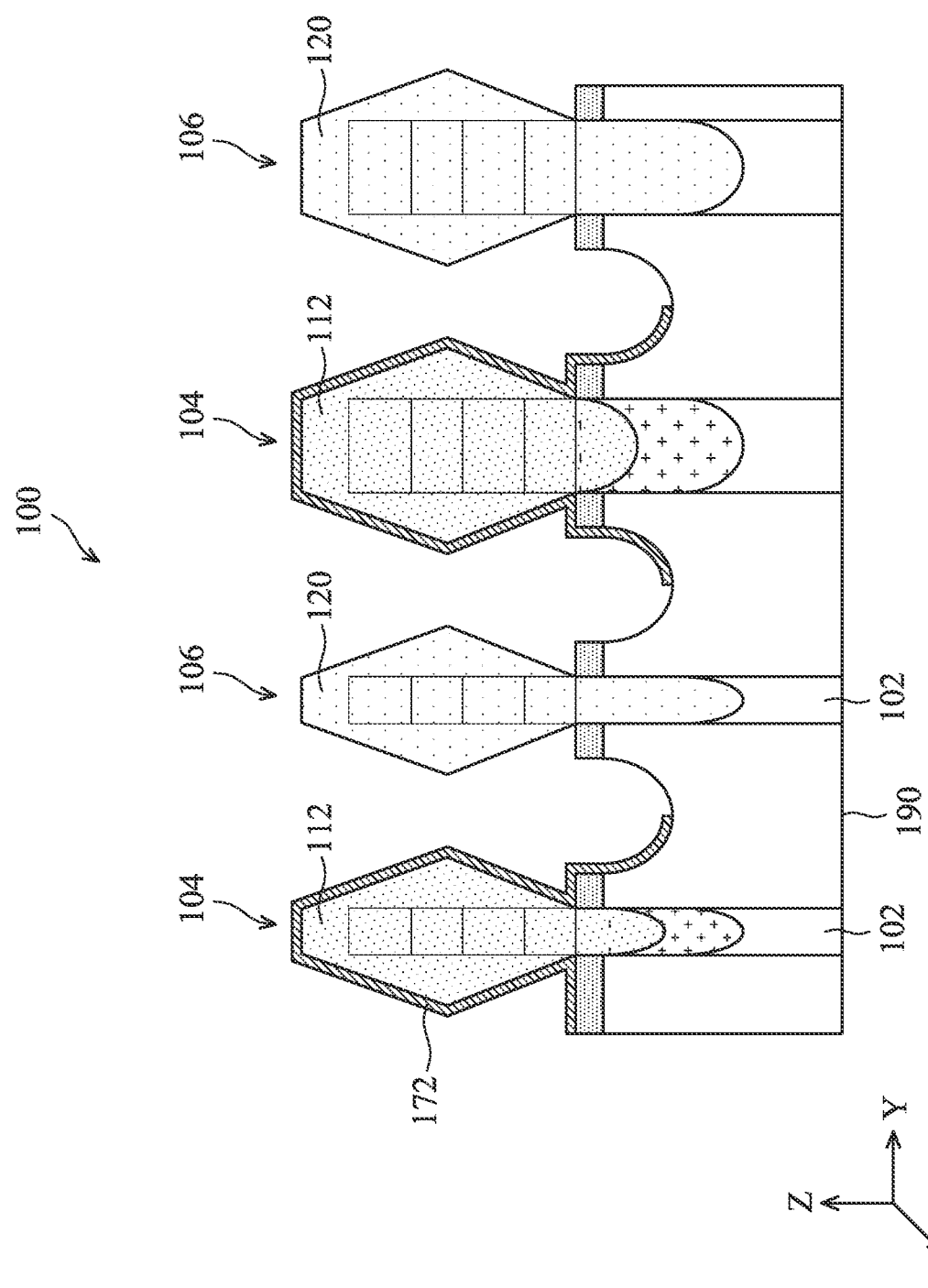
Figure 2R:
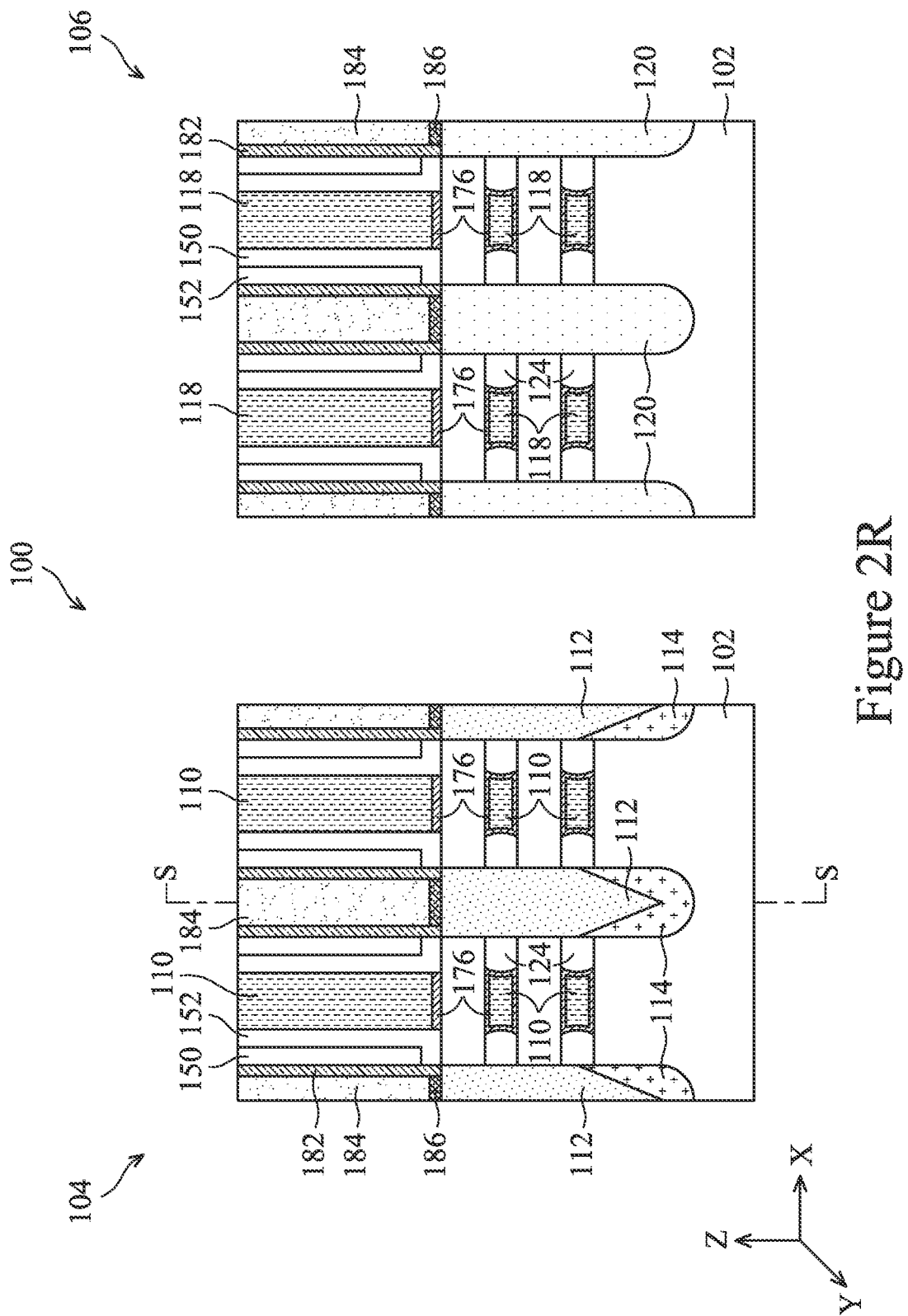
Figure 2S:
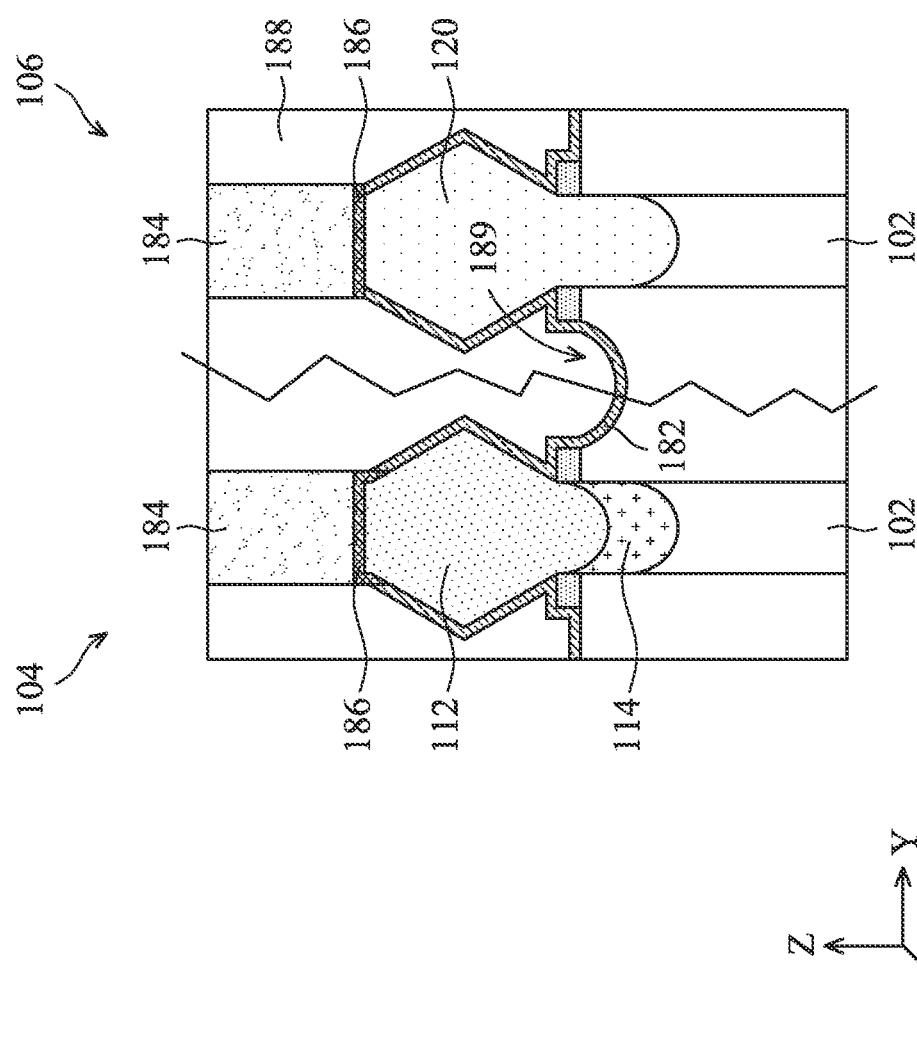
Figure 2T:
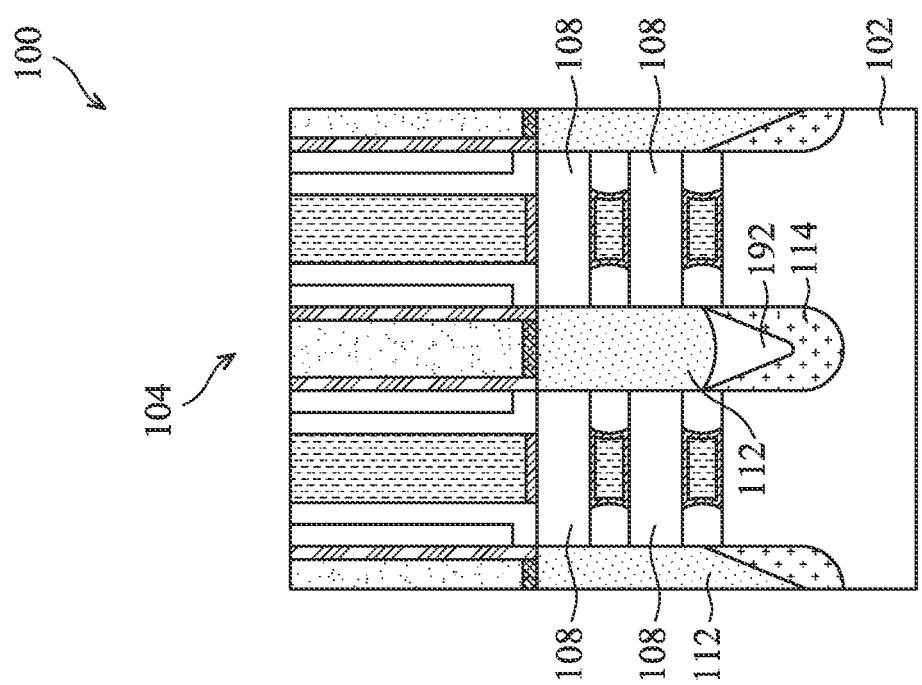

FIGS. 2A-2T are cross-sectional views of an integrated circuit 100 at various stages of processing, according to some embodiments. FIGS. 2A-2T illustrate an exemplary process for producing an integrated circuit that includes nanostructure transistors. FIGS. 2A-2T illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

FIGS. 2A-2T are cross-sectional views. Some of the views correspond to an X-Z plane and others correspond to a Y-Z plane, where X, Y, and Z are mutually orthogonal axes. Each Figure illustrates axes indicating the view of that Figure.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIGS. 2A-2T each show two different areas of the integrated circuit 100. A first area corresponds to the formation of N-type transistors 104. A second area corresponds to formation of P-type transistors 106. In practice, the first area shows formation of portions of three N-type transistors 104. The second area shows formation of portions of three P-type transistors 106. Layers or structures that are common to both the N-type transistor 104 and the P-type transistor 106 may have a same reference number. Layers, structures, or portions of layers or structures that correspond particularly to either the N-type transistor 104 the P-type transistor 106 may have different reference numbers.

FIG. 2A is an X-Z view of the integrated circuit 100. In FIG. 2A the integrated circuit 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for a P-type transistor and phosphorus for an N-type transistor.

The integrated circuit 100 includes a semiconductor stack 128. The semiconductor stack 128 may include a plurality of layers of semiconductor layers. In the view of FIG. 2A, the semiconductor stack has been patterned to define semiconductor fins 144 in the region of the first transistor 104 and to define semiconductor fins 146 in the region of the second transistors 106. The materials of the semiconductor stack 128 and the resulting semiconductor fins 144 and 146 will be provided in further detail below.

In FIG. 2A, dummy gate structures 130 have been formed over the semiconductor stack 128 at the area of the first transistors 104. Dummy gate structure 132 have been formed over the semiconductor stack 128 at the area of the second transistors 106. The dummy gate structures 130 are placed on locations at which gate electrodes of the transistors 104 will be placed. The dummy gate structures 130 are above the channel regions of the transistors 104, as will be set forth in more detail below. The dummy gate structures 132 are placed on locations at which gate electrodes of the transistors 106 will be placed. The dummy gate structures 132 are above the channel regions of the transistors 106, as will be set forth in more detail below.

The dummy gate structures 130 and 132 each include a layer of polysilicon 134. The layer of polysilicon 134 can have a thickness between 20 nm and 100 nm. The layer of polysilicon 134 can be deposited by an epitaxial growth, a CVD process, a physical vapor deposition (PVD) process, or an ALD process. Other thicknesses and deposition processes can be used for depositing the layer polysilicon 134 without departing from the scope of the present disclosure.

The dummy gate structures 130 and 132 each include a dielectric layer 136 on the layer of polysilicon 134 and a dielectric layer 138 on the dielectric layer 136. In one example, the dielectric layer 136 includes silicon nitride. In one example, the dielectric layer 138 includes silicon oxide. The dielectric layers 136 and 138 can be deposited by CVD. The dielectric layer 136 can have a thickness between 5 nm and 15 nm. The dielectric layer 138 can have a thickness between 15 nm and 50 nm. Other thicknesses, materials, and deposition processes can be utilized for the dielectric layers 136 and 138 without departing from the scope of the present disclosure.

The dielectric layers 136 and 138 have been patterned and etched to form a hard mask for the layer of polysilicon 134. The dielectric layers 136 and 138 can be patterned and etched using standard photolithography processes. After the dielectric layers 136 and 138 have been patterned and etched to form the hard mask, the layer of polysilicon 134 is etched so that only the polysilicon directly below the dielectric layers 136 and 138 remains. The result is a polysilicon fin.

A spacer layer 150 has been deposited on the polysilicon layer 134 and the dielectric layers 136 and 138. The spacer layer can include silicon nitride, SiOCN, or other suitable dielectric layers. The spacer layer 150 can be deposited by CVD, PVD, ALD, or other suitable processes. The spacer layer 150 can have a thickness between 2 nm and 10 nm. The spacer layer 150 can have other materials, deposition processes, and thicknesses without departing from the scope of the present disclosure.

A dielectric layer 152 has been deposited on the spacer layer 150. The dielectric layer 152 can include silicon nitride, SiOCN, or other suitable dielectric layers. The dielectric layer 152 can be deposited by CVD, PVD, ALD, or other suitable processes. The dielectric layer 152 can have a thickness between 2 nm and 10 nm. The dielectric layer 152 may have the same material or a different material from the spacer layer 150. Furthermore, the spacer layer 150 and the dielectric layer 152 may jointly be considered a spacer layer for the dummy gates 130 and 132. The dielectric layer 152 can have other materials, deposition processes, and thicknesses without departing from the scope of the present disclosure.

In FIG. 2A, trenches 140 have been formed through the semiconductor stack 128. The trenches 140 also extend into the substrate 102. Analogous trenches 142 are formed through the semiconductor stack 128 and into the substrate 102 at the location of the P-type transistors 106. The trenches 140 and 142 can be formed by performing an anisotropic etch that etches in the downward direction. The anisotropic etch removes the spacer layer 150 and the dielectric layer 152 from the tops of the dummy gates 130 and 132 and from the bottom space between adjacent dummy gates 130 and 132. The anisotropic etch leaves the portions of the spacer layer 150 and the dielectric layer 152 on sidewalls of the dummy gates 130 and 132. The anisotropic etch removes portions of the The trenches 140 and 142 define semiconductor fins 144 and 146. Each semiconductor fin 144 corresponds to a respective N-type transistor 104. Each fin 144 includes a plurality of semiconductor nanostructures 108 and sacrificial semiconductor nanostructures 148. The semiconductor nanostructures 108 and the sacrificial semiconductor nanostructures 148 correspond to remaining portions of the semiconductor stack 128 at the area of the N-type transistors 104. The semiconductor nanostructures 108 correspond to channel regions of the N-type transistors 104. The semiconductor nanostructures 108 can include semiconductor nanosheets, semiconductor nanowires, or other types of semiconductor nanostructures.

Each semiconductor fin 146 includes a plurality semiconductor nanostructures 116 and sacrificial semiconductor nanostructures 149. The semiconductor nanostructures 116 and the sacrificial semiconductor nanostructures 149 correspond to the remaining portions of the semiconductor stack 128 at the P-type transistors 106. The semiconductor nanostructures 116 correspond to channel regions of the P-type transistors 106. The semiconductor nanostructures 116 can include semiconductor nanosheets, semiconductor nanowires, or other types of semiconductor nanostructures.

The etching process for forming the trenches 140 and 142 can include multiple etching steps. A first etching step may remove the top and bottom portions of the spacer layer 150 and the dielectric layer 152. A second etching step may etch through the semiconductor stack 128 and the semiconductor substrate 102. Alternatively, multiple etching steps may be utilized to etch through the semiconductor stack 128.

The semiconductor nanostructures 108 may include one or more layers of Si, Ge, SiGe, GaAs, InSb, GaP, GaSb, InAlAs, InGaAs, GaSbP, GaAsSb or InP. In some embodiments, the semiconductor nanostructures 108 are the same semiconductor material as the substrate 102. Other semiconductor materials can be utilized for the semiconductor nanostructures 108 without departing from the scope of the present disclosure. In a non-limiting example described herein, the semiconductor nanostructures 108 and the substrate 102 are silicon.

The sacrificial semiconductor nanostructures 148 include a different semiconductor material than the semiconductor nanostructures 108. In an example in which the semiconductor nanostructures 108 include silicon, the sacrificial semiconductor nanostructures 148 may include SiGe. In some embodiments, the semiconductor nanostructures 108 and the sacrificial semiconductor nanostructures 148 are formed by alternating epitaxial growth processes from the semiconductor substrate 102. Alternating epitaxial growth processes are performed until a selected number of semiconductor nanostructures 108 and sacrificial semiconductor nanostructures 148 have been formed.

In FIG. 2A, there are three semiconductor nanostructures 108. However, in practice, there may be different numbers different numbers of semiconductor nanostructures 108 than three. For example, each N-type gate all around transistor 104 may include between 2 and 10 semiconductor nanostructures 108. Other numbers of semiconductor nanostructures 108 can be utilized without departing from the scope of the present disclosure.

The vertical thickness of the semiconductor nanostructures 108 can be between 2 nm and 15 nm. The thickness of the sacrificial semiconductor nanostructures 148 can be between 5 nm and 15 nm. Other thicknesses and materials can be utilized for the semiconductor nanostructures 108 and the sacrificial semiconductor nanostructures 148 without departing from the scope of the present disclosure.

In some embodiments, the sacrificial semiconductor nanostructures 148 correspond to a first sacrificial epitaxial semiconductor region having a first semiconductor composition. In subsequent steps, the sacrificial semiconductor nanostructures 148 will be removed and replaced with other materials and structures. For this reason, the semiconductor layers 119 are described as sacrificial.

In some embodiments, the semiconductor nanostructures 116 have the same material and thickness as the semiconductor nanostructures 108 because they correspond to remaining portions of the same layers of the semiconductor stack 128. In some embodiments, the sacrificial semiconductor nanostructures 149 may have the same material and thickness as the sacrificial semiconductor nanostructures 148 because they correspond to remaining portions of the same layers of the semiconductor stack 128. Alternatively, the semiconductor nanostructures 108 and 116 may be of different materials than each other. Likewise, the sacrificial semiconductor nanostructures 148 and 149 may be of different materials than each other.

FIG. 2B is an X-Z view of the integrated circuit 100. In FIG. 2B a recess step has been performed to recess the sacrificial semiconductor nanostructures 148 and 149. The recessing process removes outer portions of the sacrificial semiconductor nanostructures 148 and 149 without entirely removing the sacrificial semiconductor nanostructures 148 and 149. The recessing process can be performed with an anisotropic etch that selectively etches the material of the sacrificial semiconductor nanostructures 148 and 149 with respect to the materials of the semiconductor nanostructures 108 and 116 and the substrate 102. The anisotropic etching process can include a timed etching process. The duration of the etching process is selected to remove only a portion of the sacrificial semiconductor nanostructures 148 and 149 without entirely removing the sacrificial semiconductor nanostructures 148 and 149. The recess step results in the recesses 154 between the semiconductor nanosheets 108 and between the semiconductor nanosheets 116.

FIG. 2C is an X-Z view of the integrated circuit 100. In FIG. 2C, a dielectric layer 156 has been deposited. The dielectric layer 156 is positioned on the sidewalls of the trenches 140 and 142, at the bottom of the trenches 140 and 142, on top of the dummy gate structures 130 and 132, and within the recesses 154. The dielectric layer 156 is a dielectric material including one or more of SiOC, SiON, and SiOCN. The dielectric layer 156 can have a thickness between 2 nm and 10 nm. The dielectric layer 156 may have a greater thickness at the bottom of the trenches 140 and 142. The dielectric layer 156 can be deposited by CVD, ALD, or PVD. The dielectric layer 156 can have other materials, thicknesses, and deposition processes without departing from the scope of the present disclosure.

FIG. 2D is an X-Z view of the integrated circuit 100. In FIG. 2D, and etching processes been performed to remove portions of the dielectric layer 156. The etching process removes the dielectric layer 156 from the tops of the dummy gates 130 and 132 and from the sidewalls of the trenches 140 and 142. The dielectric layer remains in the recesses 154 and at the bottom of the trenches 140 and 142 in contact with the semiconductor substrate 102.

The portions of the dielectric layer 156 remaining within the recesses 154 of the transistors 104 corresponds to inner spacers 124. The inner spacers 124 are positioned between the semiconductor nanostructures 108. The portions of the dielectric layer 156 remaining within the recesses 154 of the transistors 106 corresponds to inner spacers 126. The inner spacers 126 are positioned between the semiconductor nanostructures 116.

The portions of the dielectric layer 156 and the bottom of the trenches 140 at the regions of the transistors 104 correspond to dielectric barriers 114. As will be set forth in more detail below, the dielectric barriers 114 serve to reduce or prevent leakage currents between the transistors 104 and the semiconductor substrate 102. The portions 164 of the dielectric layer 156 at the bottom of the trenches 142 at the regions of the transistors 106 will eventually be removed, as described in further detail below.

A timed isotropic etching process can be utilized to etch the dielectric layer 156. Because the etching processes isotropic, the etching process etches at substantially the same rate in all directions. The duration of the isotropic etch is selected so that the dielectric layer 156 is entirely removed at the filler regions on the sidewalls of the trenches 140 and on top of the dummy gate structures 130 and 132. The duration of the isotropic etch is selected so that the dielectric layer 156 is not entirely removed at the thicker portions corresponding to the bottom of the trenches 140 and 142 and the recesses 154. The result is that the inner spacers 124 and 126 and the dielectric barrier 114 remain after the timed isotropic etching process. Other etching processes, or combinations of etching processes can be utilized to etch the dielectric layer 156 without departing from the scope of the present disclosure.

FIG. 2E is an X-Z view of the integrated circuit 100. In FIG. 2E, a mask 166 has been deposited. The mask 166 has been patterned so that the mask 166 covers the dummy gate structure 130 and the trenches 140 at the N-type transistors 104, while exposing the dummy gate structures 132 and trenches 142 at the P-type transistors 106. The mask 166 can include photo resist has been patterned using standard photolithography processes. Other materials and processes can be utilized for the mask 166 without departing from the scope of the present disclosure.

FIG. 2F is an X-Z view of the integrated circuit 100. In FIG. 2F, after the mask 166 has been deposited and patterned, an etching process is performed. The etching process removes the portions 164 of the dielectric layer 156 from the bottom of the trenches 142. The etching process can include an anisotropic etch that etches selectively in the downward direction so that the inner spacers 126 are not etched. The anisotropic etching process entirely removes the portions 164 of the dielectric layer 156 from the bottom of the trenches 142.

The mask 166 covers the region of the N-type transistors 104 during the etching process. Accordingly, the etching process does not etched the dielectric barriers 114 positioned on the bottom of the trenches 140. The dielectric barriers 114 remain to perform their intended functions as will be described in further detail below.

FIG. 2G is an X-Z view of the integrated circuit 100. In FIG. 2G a hard mask layer 168 has been deposited in a blanket deposition process at the regions of the transistors 104 and 106. The hard mask layer 168 covers the dummy gates 130 and 132, the sidewalls of the trenches 140 and 142, and the bottoms of the trenches 140 and 142. The hard mask layer 168 can include Al2O3. The hard mask layer 168 can be deposited by ALD, PVD, or CVD. The hard mask layer 168 can have a thickness between 2 nm and 10 nm. Other materials, deposition processes, and thicknesses can be utilized for the hard mask layer 168 without departing from the scope of the present disclosure.

FIG. 2H is an X-Z view of the integrated circuit 100. In FIG. 2H, a mask 170 has been deposited. The mask 170 has been patterned so that the mask 170 covers the dummy gate structures 132 and the trenches 142 at the P-type transistors 106, while exposing the dummy gate structures 130 and trenches 140 at the N-type transistors 104. The mask 170 can include photo resist has been patterned using standard photolithography processes. Other materials and processes can be utilized for the mask 170 without departing from the scope of the present disclosure.

FIG. 2I is an X-Z view of the integrated circuit 100. In FIG. 2I, after the mask 170 has been deposited and patterned, an etching process is performed. The etching process removes hard mask layer 168 from the region of the N type transistors 104. The etching process does not remove the hard mask layer 168 from the region of the P type transistors 106 due to the presence of the mask 170. After the etching process, the mass 170 is removed.

FIG. 2J is an X-Z view of the integrated circuit 100. In FIG. 2J, source/drain regions 112 have been deposited in the trenches 140. The source/drain regions 112 may be grown epitaxially from the semiconductor nanostructures 108. The source/drain regions 112 may be doped in situ with N-type dopant atoms. The source/drain regions 112 of the N-type transistors 104 may include a same material as the semiconductor nanostructures 108. Alternatively, the source/drain regions 112 may include a different material than the semiconductor nanostructures 108. For example, the semiconductor nanostructures 108 may include silicon, while the source/drain regions 112 may include silicon germanium. Other materials and deposition processes can be utilized for the source/drain regions 112 without departing from the scope of the present disclosure.

The source/drain regions 112 are positioned directly on top of the dielectric barriers 114. In particular, the bottom surface of each source/drain region 112 is positioned on the top surface of a respective dielectric barrier 114. The dielectric barriers 114 separate the source/drain regions 112 from the semiconductor substrate 102. The presence of the dielectric barriers 114 ensures that leakage currents will not flow from the source/drain regions 112 into the semiconductor substrate 102. This can greatly enhance the efficiency of the N-type transistor 104 by substantially eliminating leakage currents. This reduces power consumption and heat generation.

In some embodiments, the dielectric barrier may extend above the substrate 102 a distance between 0.1 nm and 5 nm. This distance may be sufficient to ensure that there is no direct contact and substantially no leakage current between the source/drain region 112 and the substrate 102, while also ensuring full contact between the source/drain region 112 and the lowest semiconductor nanostructure 108. Nevertheless, the dielectric barrier 114 may have other configurations relative to the substrate 102 without departing from the scope of the present disclosure.

Because the hard mask layer 168 is present at the regions of the P-type transistor 106, the epitaxial growth process does not occur at the regions of the P-type transistor 106.

FIG. 2K is an X-Z view of the integrated circuit 100. In FIG. 2K a hard mask layer 172 has been deposited in a blanket deposition process at the regions of the transistors 104 and 106. The hard mask layer 172 covers the dummy gates 130, the sidewalls of the trenches 140, the bottoms of the trenches 140, and the hard mask layer 168 and the region of the P type transistors 106. Although the hard mask layer 172 is not shown at the region of the P type transistors 106, the hard mask layer 172 is nevertheless present on top of the hard mask layer 168 at the region of the P type transistors 106. The hard mask layer 172 can include Al2O3. The hard mask layer 172 can be deposited by ALD, PVD, or CVD. The hard mask layer 172 can have a thickness between 2 nm and 10 nm. Other materials, deposition processes, and thicknesses can be utilized for the hard mask layer 172 without departing from the scope of the present disclosure.

FIG. 2L is a Y-Z cross-sectional view taken along cut lines L in FIG. 2K. FIG. 2L illustrates two N-type transistors 104 and two P-type transistors 106. The left N-type transistor 104 and the left P-type transistor are narrower in the Y direction than are the right N-type transistor 104 and the right P-type transistor 106. At this stage, P-type source/drain regions have not yet been formed in the trenches 142. The N-type source/drain regions 112 may have hexagonal shapes in the Y-Z plane, though they may have other shapes without departing from the scope of the present disclosure.

FIG. 2L also illustrates shallow trench isolation (STI) regions 190 in the substrate 102. The shallow trench isolation 190 is not apparent in the X-Z views of FIGS. 2A-2K. The shallow trench isolation 190 can include silicon oxide or other dielectric materials. Various other configurations of transistors 104 and 106 may be utilized without departing from the scope of the present disclosure.

FIG. 2M is an X-Z view of the integrated circuit 100. In FIG. 2M, a mask 174 has been deposited. The mask 174 has been patterned so that the mask 174 covers the dummy gate structures 130 and the trenches 140 at the N-type transistors 104, while exposing the dummy gate structures 132 and trenches 142 at the P-type transistors 106. The mask 174 can include photo resist has been patterned using standard photolithography processes. Other materials and processes can be utilized for the mask 174 without departing from the scope of the present disclosure.

FIG. 2N is an X-Z view of the integrated circuit 100. In FIG. 2N an etching process has been performed to remove the hard mask layer 168 at the regions of the P-type transistor 106. The etching process can include a wet etch, a dry etch, or another type of etching process. Because the mask 174 covers the regions of the N-type transistors 104, the hard mask 172 is not removed by the etching process that removes the hard mask layer 168.

FIG. 2O is a Y-Z cross-sectional view taken along cut lines O in FIG. 2N. FIG. 2O illustrates the mask 174 covering the source/drain regions of the N-type transistors 104. The trenches 142 of the P-type transistors are exposed by the mask 104.

FIG. 2P is a X-Z cross-sectional view of the integrated circuit 100. In FIG. 2P, source/drain regions 120 are deposited in the trenches 142 at the regions of the P-type transistors 106. The source/drain regions 120 may be grown epitaxially from the semiconductor nanostructures 116. The source/drain regions 120 may be doped in situ with P-type dopant atoms. The source/drain regions 120 of the P-type transistors 106 may include a same material as the semiconductor nanostructures 116. Alternatively, the source/drain regions 120 may include a different material than the semiconductor nanostructures 116. For example, the semiconductor nanostructures 116 may include silicon, while the source/drain regions 120 may include silicon germanium. Other materials and deposition processes can be utilized for the source/drain regions 120 without departing from the scope of the present disclosure. Because the hard mask layer 172 covers the regions of the N-type transistors 104 during the epitaxial growth process, there is no exposed semiconductor material from which to grow further semiconductor regions at the N-type transistors 104. Accordingly, the hard mask layer 172 prevents further epitaxial growth at the N-type transistors 104 during the deposition process for the source/drain regions 120. After deposition of the source/drain regions 120, an etching process can be performed to remove the hard mask layer 172. The etching process can be a same type of etching process as previously used to remove the hard mask layer 168.

The source/drain regions 120 are positioned directly on top of the substrate 102. In particular, the bottom surface of each source/drain region 120 is positioned on the top surface of the semiconductor substrate 102 in the bottom of the trenches 142. In one example, the semiconductor material of the source/drain regions 120 is different from the semiconductor material of the semiconductor substrate 102. Accordingly, due to a mismatch in the crystal lattices of the semiconductor substrate 102 and the source/drain regions 120, the semiconductor substrate 102 may impart a strain to the source/drain regions 120. The strain improves the conductivity of the source/drain regions 120. The strain may include a tensile strain or a compressive strain. Because the dielectric barriers 114 are not present at the P-type transistors 106, the source/drain regions 120 can be grown directly from the semiconductor substrate 102 and can receive the beneficial strain as described above.

FIG. 2Q is a Y-Z cross-sectional view taken along cut lines Q in FIG. 2P. FIG. 2Q illustrates that the source/drain regions 120 have been formed at the P-type transistors 106. In the example of FIG. 2Q, the source/drain region 120 of the left P-type transistor is narrower in the Y direction than the source/drain region of the right P-type transistor 106. This illustrates that there may be different sizes of transistors. In particular, the wider source/drain regions correspond to wider channel regions of the transistors as the width of the channel regions corresponds to the widths in the Y direction of the nanostructures 108/116. The lengths of the channel regions corresponds to the lengths of the nanostructures 108/116 in the X direction. FIG. 2Q also illustrates recesses 189 in the STI 190 between the source/drain regions 112 of the N-type transistors 104 and the source/drain regions 120 of the P-type transistors 106.

FIG. 2R is an X-Z view of the integrated circuit 100. In FIG. 2R, the N-type transistor 104 and the P-type transistor 106 have been finished. The dummy gate structures 130 and 132 have been removed. This is accomplished by performing a chemical mechanical planarization (CMP) process to remove the dielectric layers 130 and 136 and a portion of the polysilicon layer 134. After the CMP process, the remainder of the polysilicon layer 134 is removed. After removal of the polysilicon layer 128, the sacrificial semiconductor nanostructures 148 and 149 are removed with an etching process that selectively removes the sacrificial semiconductor nanostructures 148 and 149 with respect to the semiconductor nanostructures 108 and 116.

After removal of the sacrificial semiconductor nanostructures 148 and 149, a gap remains where the sacrificial semiconductor nanostructures 148 and 149 were. The semiconductor nanostructures 108 and 116 are exposed. A gate dielectric layer 176 is deposited surrounding the semiconductor nanostructures 108 and 116. The gate dielectric layer 176 may include an interfacial dielectric layer and the high K dielectric layer. The interfacial dielectric layer may include silicon oxide of a thickness between 2 Å and 10 Å. The high K dielectric layer is deposited on the interfacial dielectric layer and may include hafnium oxide. The high K dielectric layer may have a thickness between 5 Å and 20 Å. The materials of the gate dielectric layer 176 may be deposited by ALD, CVD, or PVD. Other structures, materials, thicknesses, and deposition processes may be utilized for the gate dielectric layer 176 without departing from the scope of the present closure.

After deposition of the gate dielectric layer 176 around the semiconductor nanostructures 108 and 116, gate electrodes 110 and 118 are formed. The gate electrode 110 is formed at the N-type transistor 104. The gate electrode 118 is formed at the P-type transistor 106. Although FIG. 2N illustrates only a single gate metal in each of the gate electrodes 110 and 118, in practice, the gate electrodes 110 and 118 may have a plurality of gate metals. The gate electrodes 110 and 118 may include gate liner layers, adhesion layers, barrier layers, work function layers, gate fill layers, and other combinations of gate metal layers. The various liner layers, adhesion layers, barrier layers, and work function layers may include titanium, tantalum, titanium nitride, tantalum nitride, or other suitable materials, may be deposited by ALD, PVD, or CVD, and may have thicknesses between 0.2 nm and 5 nm. The gate fill material may include a metal such as tungsten, copper, aluminum, titanium, gold, or other suitable conductive materials. The gate fill material may be deposited by ALD, PVD, or CVD. The gate fill material fills all remaining spaces around the semiconductor nanostructures 108 and 116 and fills the remaining spaces vacated by removal of the polysilicon layer 128. Other materials, thicknesses, deposition processes, and structures can be utilized for the gate electrodes 108 and 116 without departing from the scope of the present disclosure. In practice, the gate electrode 110 and the gate electrode 118 may have different compositions. In particular, different numbers of layers and metals may be utilized for the gate electrodes 108 and 116 in order to achieve desired threshold voltages for the transistors 104 and 106.

FIG. 2R illustrates conductive plugs 184 contacting the source/drain layers 114 and 120. The conductive plugs 184 may include tungsten, titanium, aluminum, or other suitable conductive materials. The conductive plugs 184 may be aligned by a contact etch stop layer (CESL) 182. The CESL layer may include silicon nitride or another suitable liner material. The silicide 186 is formed at the bottom of the conductive plugs 184. The silicide 186 may include nickel silicide, titanium silicide, or other types of silicide for providing a good electrical contact between the conductive plugs 184 and the source/drain regions 112 and 120.

FIG. 2R illustrates two N-type transistors 104 and two P-type transistors 106. While the source/drain regions 112 and 120 have been described, in practice, each transistor 104 and each transistor 106 have a source region and a drain region. In one example, the central source/drain region 112 is a common source/drain region of two N-type transistors 104. Similarly, the central source/drain region 120 is a common source/drain region of two P-type transistor 106.

FIG. 2S is a Y-Z view of the integrated circuit 100 at the stage of processing of FIG. 2R, taken along cut lines S from FIG. 2R. The view of FIG. 2O illustrates the shallow trench isolation 190. The view of FIG. 2S also illustrates an interlevel dielectric layer 188 on around the source/drain regions 112 and 120 and the conductive plugs 184. FIG. 2S also illustrates the dielectric barrier 114 positioned between the semiconductor substrate 102 and the source/drain region 112. The source/drain region 120 is in direct contact with the semiconductor substrate 102. Various other configurations of transistors 104 and 106 may be utilized without departing from the scope of the present disclosure. While FIG. 2S illustrates source/drain contacts 184 on both the source/drain region 112 and the source/drain region 120, in practice, one or both of the source/drain regions 112/120 may not be contacted by a source/drain contact 184 depending on the specific connection scheme for the corresponding transistors.

FIG. 2T illustrates N type transistors 104 substantially similar to the end type transistors 104 of FIG. 2S. However, in FIG. 2T, a void 192 has formed between the dielectric barrier 114 and the source/drain region 112. This may be a natural result of growing the source/drain regions 112 epitaxially from the semiconductor nanostructures 108 rather than from the semiconductor substrate 102. Because of the presence of the dielectric barrier 114, the source/drain regions 112 are not grown from the semiconductor substrate 102. This may result in the void 192 shown in FIG. 2T.

FIGS. 3A-3F illustrate various nanostructure transistors of an integrated circuit 100 at the stage of processing corresponding to FIG. 2N. However, some features of the transistors in FIGS. 3A-3F vary in shape or size from the transistors shown in FIGS. 2A-2T. Various shapes, sizes, and even configurations of transistor features can be utilized without departing from the scope of the present disclosure. FIGS. 3A-3F are cross-sectional views in the X-Z plane.

FIG. 3A illustrates an N-type transistor 104 including the dielectric barrier 114 below the source/drain regions 112. The transistor 104 of FIG. 3A is a shorter channel device with a pitch between 20 nm and 70 nm, though other dimensions can be utilized without departing from the scope of the present disclosure. The relatively small pitch enables the formation of the dielectric barrier 114.

The transistor 106 of FIG. 3B corresponds to the P-type transistor 106 of FIG. 2N. The P-type transistor 106 is a shorter channel device having a pitch between 20 nm and 70 nm, though other dimensions can be used without departing from the scope of the present disclosure. As described previously, the dielectric barrier 114 is not present for the P-type transistor 106.

The transistor 191 of FIG. 3C is a transistor in which the source/drain regions 112 are doped with P-type dopants and the transistor is formed in conjunction with a P-type well. The transistor 191 operates as a pickup region that discharges current from the source/drain region into the substrate 102 and is not configured with the dielectric barrier 114.

The transistor 193 of FIG. 3D is a transistor in which the source/drain regions 120 are doped with N-type dopants and the transistor is formed in conjunction with an N-type well. The transistor 193 operates as a pickup region that discharges current from the source/drain region into the substrate 102 and is not configured with the dielectric barrier 114.

The transistor 194 of FIG. 3E is a long channel N-type transistor having a pitch greater than 70 nm. Due to the large pitch, it may not be practical to form the dielectric barrier 114 for the transistor 194. Accordingly, the dielectric barrier 114 is not present for the long channel transistor 194. Alternatively, a dielectric barrier 114 can also be formed for the long channel transistor 194.

The transistor 196 of FIG. 3F is a long channel P-type transistor having a pitch greater than 70 nm. The P-type transistor 196 benefits from the strain imparted from the crystallized mismatch between the substrate 102 and the source/drain regions 120. Accordingly, the dielectric barrier 114 is not present for the long channel transistor 196.

The transistors 104, 106, 191, 193, 194, and 196 may be formed on the same wafer at the same time. The presence or absence of the dielectric barrier 114 can be achieved patterning the mask 166 of FIG. 2F to expose the areas where transistor should be formed with the dielectric barrier 114. In the example of FIGS. 3A-3F, the mask 166 with only expose the area of the transistor 104. Alternatively, the dielectric barrier 114 can be formed for transistors other than or in addition to the transistor 104. Furthermore, the transistors 104, 106, 191, 193, 194, and 196 may have differing channel widths and differing channel lengths.

Figure 4:
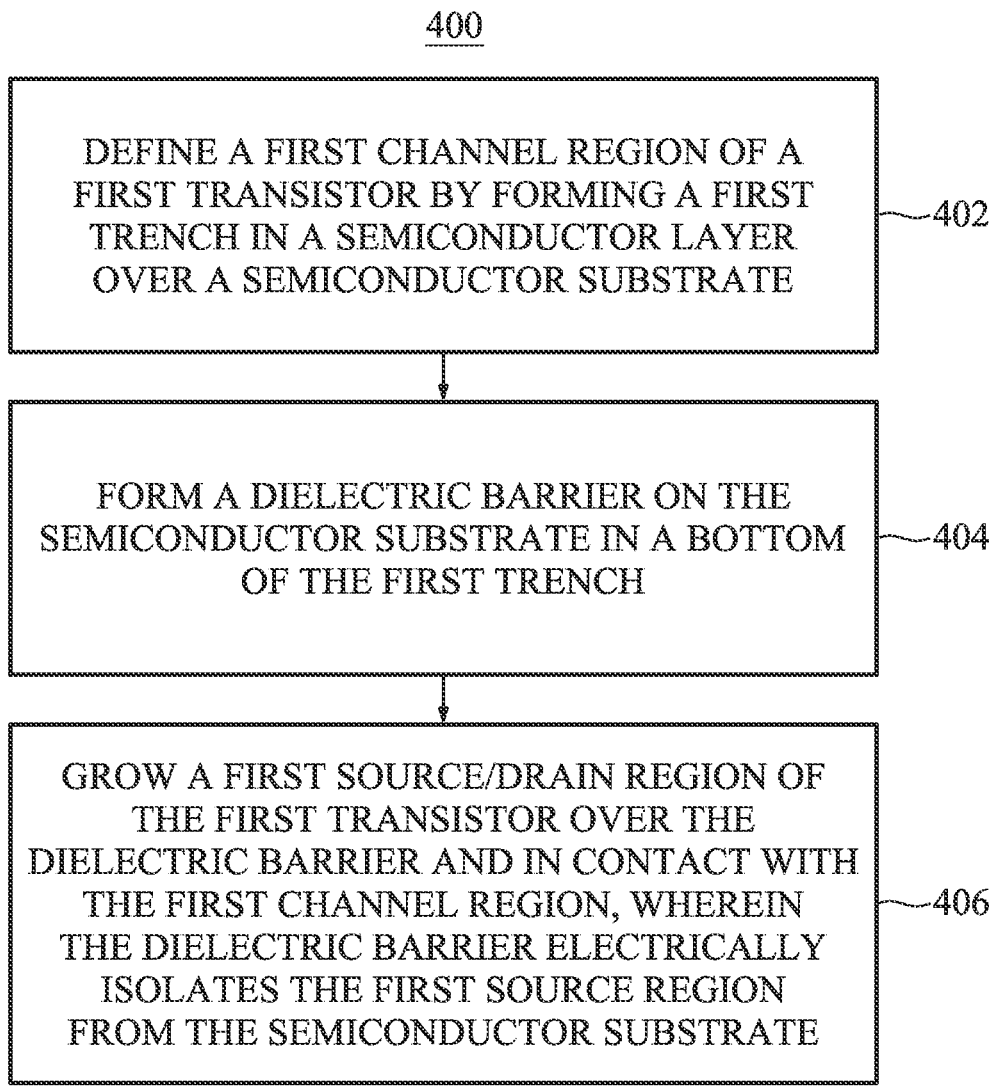
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1-3G. At 402, the method 400 includes defining a first channel region of a first transistor by forming a first trench in a semiconductor layer over a semiconductor substrate. One example of a semiconductor substrate is the semiconductor substrate 102 of FIG. 1. One example of a first transistor is the transistor 104 of FIG. 1. One example of a first channel region is the channel region 108 of FIG. 1. One example of a semiconductor layer is the semiconductor layer 128 of FIG. 2. One example of a trench is the trench 140 of FIG. 2. At 404, the method 400 includes depositing a dielectric barrier on the semiconductor substrate in a bottom of the first trench. One example of a dielectric barrier is the dielectric barrier 114 of FIG. 1. At 406, the method 400 includes growing a first source/drain region of the first transistor on the dielectric barrier and in contact with the first channel region, wherein the dielectric barrier electrically isolates the first source region from the semiconductor substrate. One example of a first source region is the source/drain region 110 of FIG. 1.

FIG. 5 is a flow diagram of a method 500 for forming an integrated circuit, in accordance with some embodiments. The method 500 can utilize processes, structures, and components described in relation to FIGS. 1-4. At 502, the method 500 includes forming, over a semiconductor substrate, a first fin including a plurality of semiconductor nanostructures collectively corresponding to a first channel region of a first gate all around transistor. One example of a semiconductor substrate is the semiconductor substrate 102 of FIG. 2A. One example of a first fin is a fin 144 of FIG. 2A. One example of semiconductor nanostructures are the semiconductor nanostructures 108 of FIG. 2A. One example of a gate all around transistor is the gate all around transistor 104 of FIG. 2N. At 504, the method 500 includes forming, over the semiconductor substrate, a second fin separated from the first fin by a first trench and including a plurality of second semiconductor nanostructures collectively corresponding to a second channel region of a second gate all around transistor. One example of a second fin is another of the fins 144 of FIG. 2J. One example of a trench is the trench 140 of FIG. 2J. At 506, the method 500 includes depositing a dielectric material in recesses between the plurality of first semiconductor nanostructures, between the plurality of second semiconductor nanostructures, and on a bottom of the first trench. One example of a dielectric material is the dielectric layer 156 of FIG. 2C. One example of recesses are the recesses 154 of FIG. 2B. At 508, the method 500 includes epitaxially growing a common source/drain region of the first and second gate all around transistors over the dielectric material and in contact with the first and second semiconductor nanostructures. One example of a source/drain region is a source/drain region 110 of FIG. 2J. One example of a dielectric barrier is the dielectric barrier 114 of FIG. 2J.

Embodiments of the present disclosure provide an integrated circuit with nanostructure transistors having improved performance. The nanostructure transistors each have a plurality of nanostructures formed over a substrate. The nanostructures act as channel regions of the nanostructure transistor. Each nanostructure transistor includes source/drain regions above the semiconductor substrate and in contact with the nanostructures. Embodiments of the present disclosure reduce leakage currents from the source/drain regions by forming a dielectric barrier between a bottom of the source/drain regions and the semiconductor substrate. The dielectric barriers prevent the flow of leakage currents from the source/drain regions to the semiconductor substrate because no current will flow through the dielectric barriers. This can greatly improve the overall functionality of the integrated circuit by substantially eliminating a major source of power consumption. Accordingly, an integrated circuit in accordance with principles of the present disclosure consumes less power and generates less heat. The reduction in heat can also prevent damage to the integrated circuit from overheating. Thus, principles of the present disclosure provide substantial benefits to transistor function and overall integrated circuit function.

In some embodiments, an integrated circuit includes a semiconductor substrate and a first transistor. The first transistor includes a first channel region including first and second semiconductor nanostructures vertically separated from each other, an inner spacer between the first and second semiconductor nanostructures, and a first source/drain region above the semiconductor substrate and coupled to the first channel region. The integrated circuit includes a dielectric barrier of a same dielectric material as the inner spacer over the semiconductor substrate and electrically isolating the first source region from the semiconductor substrate.

In some embodiments, a method includes defining a first channel region of a first transistor by forming a first trench in a semiconductor layer over a semiconductor substrate and depositing a dielectric barrier on the semiconductor substrate in a bottom of the first trench. The method includes growing a first source/drain region of the first transistor over the dielectric barrier and in contact with the first channel region, wherein the dielectric barrier electrically isolates the first source region from the semiconductor substrate.

In some embodiments, a method includes forming, over a semiconductor substrate, a first fin including a plurality of semiconductor nanostructures collectively corresponding to a first channel region of a first gate all around transistor. The method includes forming, over the semiconductor substrate, a second fin separated from the first fin by a first trench and including a plurality of second semiconductor nanostructures collectively corresponding to a second channel region of a second gate all around transistor. The method includes depositing a dielectric material in recesses between the plurality of first semiconductor nanostructures, between the plurality of second semiconductor nanostructures, and on a bottom of the first trench and epitaxially growing a common source/drain region of the first and second gate all around transistors on the dielectric material and in contact with the first and second semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   defining a first channel region of a first transistor by forming a first trench in a semiconductor layer over a semiconductor substrate;
   forming a dielectric barrier on the semiconductor substrate in a bottom of the first trench; and
   growing a first source/drain region of the first transistor over the dielectric barrier and in contact with the first channel region, wherein the dielectric barrier electrically isolates the first source region from the semiconductor substrate;
   forming a second channel region of a second transistor by forming a second trench in the semiconductor layer over the semiconductor substrate;
   selectively forming a masking layer over the first transistor; and
   growing a second source/drain region of the second transistor in contact with the semiconductor substrate at a bottom of the second trench, wherein the first source/drain region and the second source/drain region have a same first conductivity type.

2. The method of claim 1, further comprising:
   doping the semiconductor substrate under the first channel region with the first conductivity type; and
   doping the semiconductor substrate under the second channel region with a second conductivity type opposite the first conductivity type.

3. The method of claim 1, wherein growing the first source/drain region of the first transistor over the dielectric barrier includes:
   growing the first source/drain region to form a void between the first source/drain region and the dielectric barrier.

4. The method of claim 1, wherein growing the first source/drain region of the first transistor over the dielectric barrier includes:
   growing the first source/drain region to cover and contact an entirety of a top surface of the dielectric barrier.

5. The method of claim 1, wherein forming the dielectric barrier on the semiconductor substrate includes:
   partially removing a sacrificial semiconductor nanostructure to form a recess between a first semiconductor nanostructure and a second semiconductor nanostructure;
   depositing an inner spacer layer to fill in the recess, wherein the inner spacer layer is over a bottom portion of the first trench; and
   partially removing the inner spacer layer to form the dielectric barrier.

6. The method of claim 5, wherein partially removing the inner spacer layer includes:
   partially removing the inner spacer layer to laterally expose the first semiconductor nanostructure and the second semiconductor nanostructure, wherein a bottommost portion of the inner spacer layer is in contact with the dielectric barrier.

7. The method of claim 5, wherein partially removing the inner spacer layer includes:
   partially removing the inner spacer layer to laterally expose the first semiconductor nanostructure and the second semiconductor nanostructure, wherein a bottommost portion of the inner spacer layer is separated from the dielectric barrier.

8. A method, comprising:
   forming a pair of stacked first channels of a first transistor above a semiconductor substrate;
   forming a pair of stacked second channels of a second transistor above the semiconductor substrate;
   forming a first recess between the pair of stacked first channels;
   forming a second recess between the pair of stacked second channels;
   depositing a dielectric layer in a first trench adjacent to the first channels and in a second trench adjacent to the second channels;
   forming, from the dielectric layer, a first inner spacer in the first recess, a second inner spacer in the second recess, a first dielectric barrier in contact with the semiconductor substrate in the first trench, and a second dielectric barrier in contact with the semiconductor substrate in the second trench by etching a portion of the dielectric layer;
   removing the second dielectric barrier from the second trench;
   forming a first source/drain region of the first transistor in the first trench above and in contact with the first dielectric barrier and coupled to the first and second channels, wherein the dielectric barrier electrically isolates the first source/drain region from the semiconductor substrate; and
   forming, after removing the second dielectric barrier, a second source/drain region of the second transistor in the second trench in contact with semiconductor substrate.

9. The method of claim 8, wherein a conductivity type of the second source/drain region is the same as that of the first source/drain region, and a channel length of the second transistor is different than that of the first transistor.

10. The method of claim 8, comprising forming a shallow trench isolation region in the semiconductor substrate between the first source/drain region and the second source/drain region and including recess in a top surface of the shallow trench isolation region between the first source/drain region and the second source/drain region, wherein the first source/drain region and the second source/drain region are of differing conductivity types.

11. The method of claim 8, wherein the dielectric barrier includes at least one of SiN, SiON, and SiOCN.

12. The method of claim 8, further comprising forming a void between the first source/drain region and the first dielectric barrier.

13. The method of claim 8, wherein the first source/drain region has a first conductivity type and the second source/drain region has a second conductivity type different than the first conductivity type.

14. The method of claim 13, wherein the first channels have a same length as the second channels.

15. The method of claim 13, wherein the first channels have a different length than the second channels.

16. The method of claim 13, wherein the semiconductor substrate below the first channels has the first conductivity type, wherein the semiconductor substrate below the second channels has the first conductivity type.

17. The method of claim 13, wherein the semiconductor substrate below the first channels has the first conductivity type, wherein the semiconductor substrate below the second channels has the second conductivity type.

18. A method, comprising:
   defining a first channel region of a first transistor by forming a first trench in a semiconductor layer over a semiconductor substrate, the semiconductor substrate below the first channel region being doped with a first conductivity type;

defining a second channel region of a second transistor by forming a second trench in the semiconductor layer over the semiconductor substrate, the semiconductor substrate below the second channel region being doped with a second conductivity type opposite the first conductivity type;

forming a dielectric barrier on the semiconductor substrate in a bottom of the first trench;

forming a first source/drain region of the first transistor in the first trench over the dielectric barrier and in contact with the first channel region, wherein the dielectric barrier electrically isolates the first source/drain region from the semiconductor substrate, and forming a second source/drain region of the second transistor in the second trench in contact with the semiconductor substrate in a bottom of the second trench and in contact with the second channel region, wherein the first source/drain region and the second source/drain region both have the first conductivity type.

19. The method of claim 18, wherein the dielectric barrier includes at least one of SiN, SiON, and SiOCN.

20. The method of claim 18, wherein the first channel region and the second channel region have a same length.

* * * * *